United States Patent [19]
Hatakeyama et al.

[11] Patent Number: 5,972,482
[45] Date of Patent: *Oct. 26, 1999

[54] PRINTED CIRCUIT BOARD AND METHOD OF MANUFACTURING THE SAME

[75] Inventors: Akihito Hatakeyama, Suita; Seiichi Nakatani, Hirakata; Kouji Kawakita, Jouyou; Hiroshi Sogou, Nishinomiya; Tatsuo Ogawa, Amagasaki; Tamao Kojima, Suita, all of Japan

[73] Assignee: Matsushita Electric Industrial Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/740,261

[22] Filed: Oct. 25, 1996

Related U.S. Application Data

[63] Continuation of application No. 08/607,249, Mar. 4, 1996, abandoned, which is a continuation of application No. 08/309,735, Sep. 21, 1994, abandoned.

[30] Foreign Application Priority Data

Sep. 22, 1993 [JP] Japan ................................. 5-236220
Oct. 20, 1993 [JP] Japan ................................. 5-262175

[51] Int. Cl.$^6$ ....................................................... B32B 9/00
[52] U.S. Cl. .................. 428/209; 428/321.3; 428/304.4; 428/901
[58] Field of Search ..................................... 428/209, 210, 428/321.3, 304.4, 901

[56] References Cited

U.S. PATENT DOCUMENTS

| 4,383,363 | 5/1983 | Hayakawa et al. ................... 29/847 |
| 4,967,314 | 10/1990 | Higgins, III ............................ 361/414 |
| 5,346,750 | 9/1994 | Hatakeyama et al. ................ 428/209 |
| 5,652,042 | 7/1997 | Kawakita et al. ..................... 428/209 |

FOREIGN PATENT DOCUMENTS

| 0 530 840 | 3/1993 | European Pat. Off. . |
| 0 568 930 | 11/1993 | European Pat. Off. . |

OTHER PUBLICATIONS

Patent Abstracts of Japan, vol. 15, No. 367 (Sep. 17, 1991).
Patent Abstracts of Japan, vol. 17, No. 640 (Nov. 26, 1993).
Patent Abstract of Japan, vol. 15, No. 506 (Dec. 20, 1991).
Patent Abstract of Japan, vol. 13, No. 413 (Sep. 12, 1989).
Patent Abstract of Japan, vol. 13, No. 230 (May 25, 1989).
Patent Abstract of Japan, vol. 17, No. 583 (Oct. 22, 1993).

*Primary Examiner*—Timothy Speer
*Assistant Examiner*—Cathy F. Lam
*Attorney, Agent, or Firm*—Morrison & Foerster

[57] ABSTRACT

A printed circuit board includes an uncured substrate material with closed voids which are disposed with a through-hole. When the through-hole is formed, voids which exist in the substrate material open from inner wall of the through-hole to form a hollow-shaped part. By filling the through-hole and the hollow-shaped part with conductive paste, the adhesion improves by the increased holding effect between the conductive paste and the wall surface of the through-hole.

15 Claims, 14 Drawing Sheets

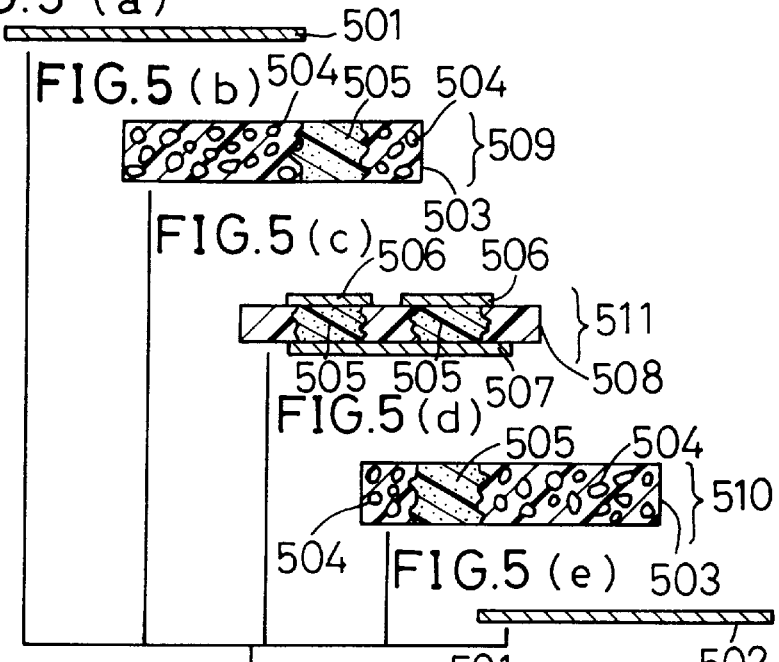
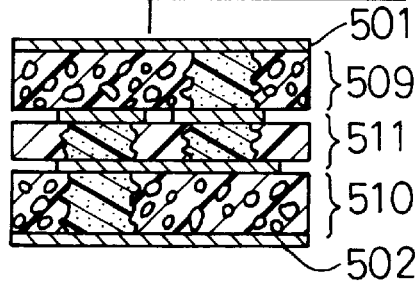
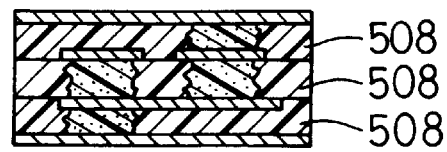
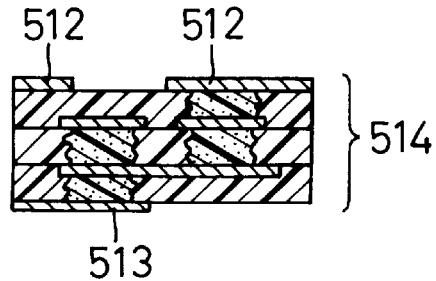

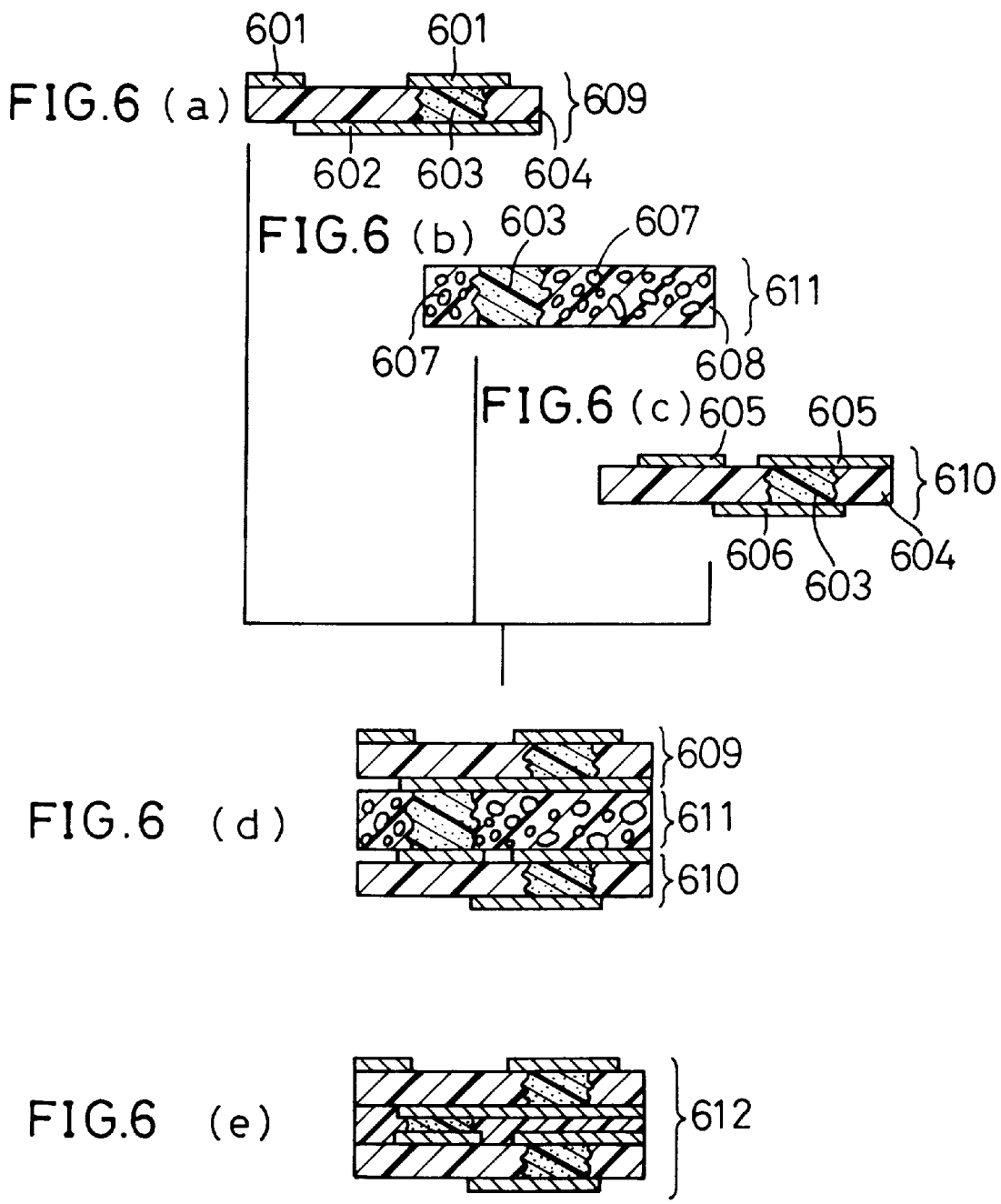

FIG. 8 (a) (PRIOR ART) 
FIG. 8 (b) (PRIOR ART) 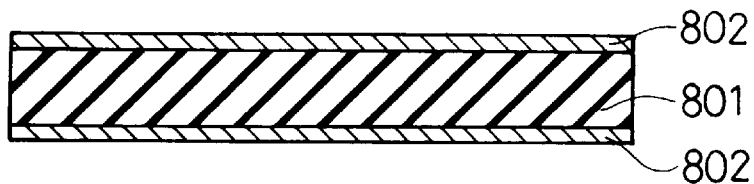
FIG. 8 (c) (PRIOR ART) 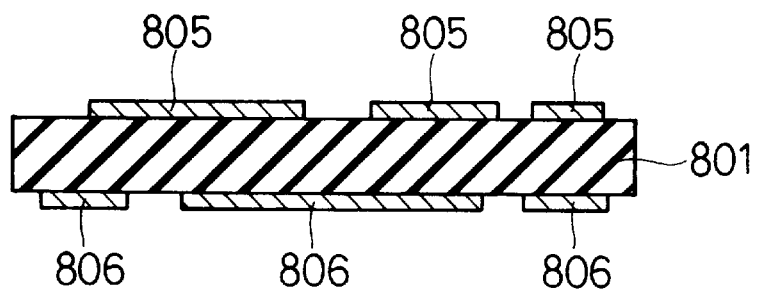
FIG. 8 (d) (PRIOR ART) 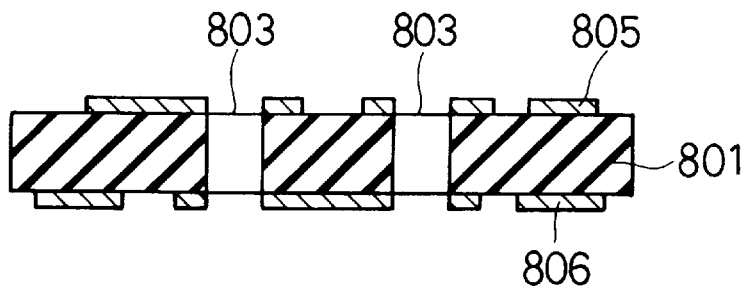
FIG. 8 (e) (PRIOR ART) 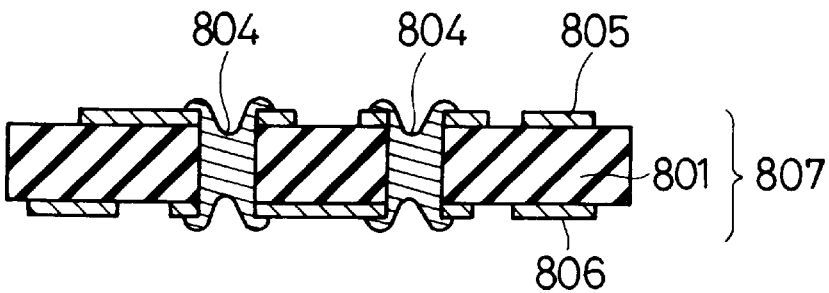

1

PRINTED CIRCUIT BOARD AND METHOD OF MANUFACTURING THE SAME

This application is a continuation of U.S. application Ser. No. 08/607,249, filed Mar. 4, 1996, which is a continuation of U.S. application Ser. No. 08/309,735, filed Sep. 21, 1994, both now abandoned.

FIELD OF THE INVENTION

This invention relates to a printed circuit board used for electronic devices, and further relates to a method of manufacturing the printed circuit board.

BACKGROUND OF THE INVENTION

Recently, following the tendency of electronic devices towards compact size and higher mounting density, multilayer printed circuit boards have been strongly demanded, not only for industrial but also for consumer use. This type of multilayer printed circuit boards requires employing inner-via-hole connections between a plurality of circuit patterns and also requires high reliability.

A conventional method of manufacturing a double sided printed circuit board is described as follows. FIGS. 8 (a) to (e) are cross-sectional views showing a method of manufacturing a conventional double sided printed circuit board. First, an insulating substrate 801 such as glass-epoxy is provided as shown in FIG. 8 (a). Then, copper foils 802 are applied on both sides of insulating substrate 801 as shown in FIG. 8 (b). Subsequently, insulating substrate 801 and copper foils 802 are bonded to each other through heating and pressurization. Thereafter, by using a conventional technique such as etching or the like, copper foils 802 are formed into a first circuit pattern 805 and a second circuit pattern 806 as illustrated in FIG. 8 (c). Next, as shown in FIG. 8 (d), through-holes 803 are drilled at places where first circuit pattern 805 and second circuit pattern 806 will be electrically connected. After that, conductive paste 804 is filled into through-holes 803 by a printing process as shown in FIG. 8 (e), and the paste is hardened.

In the manner as described above, first circuit pattern 805 and second circuit pattern 806 are connected by conductive paste 804 filled into through-holes 803, and thus, a double sided printed circuit board 807 is obtained.

However, the above-mentioned conventional structure has the problem that adhesion between the conductive paste and the wall surface of the through-hole is poor. In addition, there is a gap in coefficient of thermal expansion between the conductive paste and the insulating substrate so that a boundary face of the conductive paste and the through-hole breaks due to the thermal shock of solder dipping. As a result, a failure in continuity occurs.

SUMMARY OF THE INVENTION

It is an objective of this invention to solve the above-noted problems in the conventional system by improving adhesion between the conductive resin compound and the wall surface of the through-hole in the substrate. Another object of this invention is to provide a printed circuit board with high reliability. A further object of this invention is to provide a method of manufacturing this printed circuit board.

In order to accomplish these and other objects and advantages, a printed circuit board of the first embodiment of the invention comprises a resin impregnate fiber sheet substrate with through-holes formed in the thickness direction and a conductive resin compound filled into the through-holes in the thickness direction for electrical connection, wherein the substrate and the conductive resin compound are bonded to each other chemically and physically.

It is preferable that the substrate and the conductive resin compound are bonded to each other such that the conductive resin compound penetrates into the substrate.

Furthermore, it is preferable that the conductive resin compound comprises metallic particulates and resin, and in addition, that the substrate and the conductive resin compound are bonded to each other through impregnation of the resin which is one component of the conductive resin compound that penetrates into the substrate.

It is also preferable that the substrate and the conductive resin compound are bonded to each other through covalent bonding, or self-adhesion between the resin which is one component of the conductive resin compound and the impregnate resin in the substrate.

Furthermore, it is preferable that the substrate and the conductive resin compound are bonded to each other such that the fiber of the substrate penetrates into the conductive resin compound.

It is preferable that the impregnate resin of the substrate and the resin which is one component of the conductive resin compound are both thermosetting resins.

It is also preferable that the thermosetting resin comprises at least one resin selected from the group consisting of epoxy resin, thermosetting polybutadiene resin, phenol resin, and polyimide resin.

Furthermore, it is preferable that the resin impregnate fiber sheet of the substrate comprises at least one fiber selected from the group consisting of heat-resisting synthetic fiber and glass fiber.

In addition, it is preferable in this example that the heat-resisting synthetic fiber comprises at least one fiber selected from the group consisting of aromatic polyamide fiber and polyimide fiber.

It is also preferable in this example that the resin impregnate fiber sheet of the substrate is a nonwoven fabric.

Furthermore, it is preferable that the metallic particulate in the conductive resin compound is at least one metal selected from the group consisting of gold, silver, copper, palladium, nickel, and an alloy thereof.

Furthermore, it is preferable that the metallic particulates in the conductive resin compound are present in an amount of from 80 to 92.5 percent by weight.

It is preferable that each metallic particulate in the conductive resin compound has an average diameter of from 0.2 to 20 µm. The average diameter can be measured using a microscopic method or a light scattering method.

In addition, it is preferable in this example that the average diameter of the through-hole filled with the conductive resin compound is from 50 to 300 µm.

Furthermore, it is preferable in this example that a circuit is formed on both the surface of the substrate and at the terminal of the conductive resin compound.

It is also preferable in this example that the substrate is either one sheet or a plurality of sheets.

A second embodiment of this invention is a method of manufacturing a printed circuit board comprising the steps of: laminating both sides of an uncured resin impregnate fiber sheet substrate material having inner holes or voids with cover films, forming through-holes in the substrate material in the thickness direction by laser irradiation, filling the through-holes with conductive paste, removing the cover films and applying a metal foil on at least one side of the substrate material, bonding the substrate material with the conductive paste by compressing and hardening the substrate material through heating and pressurization, and forming predetermined patterns on the metal foil. The above-mentioned "uncured resin" in the substrate material also includes semi-hardened resin.

It is preferable in this embodiment that metal foil is applied on both sides of the substrate material.

Furthermore, it is preferable in this embodiment that a method of manufacturing a printed circuit board comprises the steps of: laminating both sides of an uncured resin impregnate fiber sheet substrate material having inner holes or voids with cover films, forming through-holes in the substrate material in the thickness direction by laser irradiation, filling the through-holes with conductive paste, removing the cover films and applying a metal foil on one side of each sheet, thereby forming two sheets of intermediate, disposing the intermediates in a state in which the sides with metal foils face outside, holding at least two layers of circuit substrates with circuit patterns in a core, bonding the substrate material with the conductive paste by compressing and hardening with heating and pressurization, and forming predetermined patterns on the metal foils.

Furthermore, it is preferable in this embodiment that the method of manufacturing a printed circuit board comprises the steps of: laminating both sides of an uncured resin impregnate fiber sheet substrate material having inner holes or voids with cover films, forming through-holes in the substrate material in the thickness direction by laser irradiation, filling the through-holes with conductive paste, removing the cover films, thereby forming an intermediate connecting member, holding the intermediate connecting member between a plurality of double sided printed circuit boards, and bonding the substrate material with the conductive paste by compressing and hardening the whole through heating and pressurization.

Furthermore, it is preferable that the inner holes in the uncured resin impregnate fiber sheet substrate material are closed voids.

It is also preferable that each closed void has a diameter ranging from 5 to 20 $\mu$m in the uncured substrate material.

Furthermore, it is preferable that the porosity of the uncured substrate material having voids ranges from 2 to 35%.

In addition, it is preferable that the temperature of the substrate material in the heating step ranges from 170 to 260° C.

Furthermore, it is preferable that the pressure on the substrate material in the pressurizing step ranges from 20 to 80 kg/cm$^2$.

It is also preferable that a part of the fiber in the substrate material remains in the through-holes by laser irradiation.

Furthermore, it is preferable that a compound of metallic particulates and resin is used as the conductive resin compound to fill the through-holes, and that they are bonded together through impregnation of the resin which is one component of the conductive resin compound that penetrates into the substrate.

In addition, it is preferable that the resin which is one component of the conductive resin compound and the impregnate resin in the substrate belong to the resin having the same functional group, and that they are bonded to each other through covalent bonding, or self-adhesion.

Furthermore, it is preferable that the impregnate resin in the substrate and the resin which is one component of the conductive resin compound are both thermosetting resins, and further, that they comprise at least one resin selected from the group consisting of epoxy resin, thermosetting polybutadiene resin, phenol resin, and polyimide resin.

Furthermore, it is preferable that a roll coating method is used to fill the conductive resin compound in the through-holes.

It is also preferable that the resin impregnate fiber sheet of the substrate comprises at least one fiber selected from the group consisting of heat-resisting synthetic fiber and glass fiber.

Furthermore, it is preferable that the heat-resisting synthetic fiber comprises at least one fiber selected from the group consisting of aromatic polyamide fiber and polyimide fiber.

In addition, it is preferable that the resin impregnate fiber sheet of the substrate is a nonwoven fabric.

It is preferable that the metallic particulate in the conductive resin compound is at least one metal selected from the group consisting of gold, silver, copper, palladium, nickel, and an alloy thereof.

Furthermore, it is preferable that the metallic particulates in the conductive resin compound are present in an amount of from 80 to 92.5 percent by weight.

It is also preferable that each metallic particulate in the conductive resin compound has an average diameter of from 0.2 to 20 $\mu$m.

Furthermore, it is preferable that an average diameter of the through-hole filled with the conductive resin compound is from 50 to 300 $\mu$m.

Furthermore, it is preferable that the laser beam is selected from the group consisting of carbon dioxide laser, YAG laser, and excimer laser.

According to the first embodiment of the invention, a printed circuit board comprises a resin impregnate fiber sheet substrate with through-holes formed in the thickness direction and a conductive resin compound filled into the through-holes in the thickness direction for electrical connection, wherein the substrate and the conductive resin compound are bonded to each other. Thus, the adhesion between the conductive resin compound and the wall surface of the through-hole in the substrate is improved, thereby attaining a highly reliable printed circuit board.

According to the above-noted embodiment, it is preferable that the substrate and the conductive resin compound are bonded to each other so that the conductive resin compound penetrates into the substrate. This serves to "anchor" and to improve the adhesion between the conductive paste and the wall surface of the through-hole.

Furthermore, it is preferable that the conductive resin compound is composed of metallic particulates and resin, and in addition, the substrate and the conductive resin compound are bonded to each other through impregnation of the resin which is one component of the conductive resin compound in the substrate. As a result, the substrate and the conductive resin compound are bonded strongly together. In addition, the conductive component in the conductive resin compound has a higher concentration, and therefore, a printed circuit board of high conductive reliability can be attained.

According to the first embodiment, it is also preferable that the substrate and the conductive resin compound are bonded to each other through covalent bonding, or self-adhesion between the resin which is one component of the conductive resin compound and the impregnate resin in the substrate, thereby enforcing the binding.

Furthermore, it is preferable that the substrate and the conductive resin compound are bonded to each other so that the fiber of the substrate penetrates into the conductive resin compound. This configuration enlarges the contact area surrounding the fiber. Thus, the substrate and the conductive resin compound are bonded even stronger.

Furthermore, it is preferable that the impregnate resin of the substrate and the resin which is one component of the conductive resin compound are both thermosetting resins, in order to provide excellent heat resistance.

It is also preferable that the thermosetting resin comprises at least one resin selected from the group consisting of epoxy resin, thermosetting polybutadiene resin, phenol resin, and polyimide resin. As a result, the resin has an excellent practical use from the viewpoint of heat resistance.

Furthermore, it is preferable that the resin impregnate fiber sheet of the substrate comprises at least one fiber selected from the group consisting of heat-resisting synthetic fiber and glass fiber, to provide excellent heat resistance.

Additionally, it is preferable that the heat-resisting synthetic fiber comprises at least one fiber selected from the group consisting of aromatic polyamide fiber and polyimide fiber, to provide excellent heat resistance. In addition, it is easy to make holes in this fiber by using a laser beam.

Furthermore, according to the above-noted example, it is preferable that the resin impregnate fiber sheet of the substrate is a nonwoven fabric. As a result, it is easy to control the thickness of the substrate, and furthermore, cost can be reduced. The thickness can vary according to the use of the substrate, but a suitable thickness is from 30 to 50 $\mu$m.

It is preferable that the metallic particulate in the conductive resin compound is at least one metal selected from the group consisting of gold, silver, copper, palladium, nickel, and an alloy thereof, in order to maintain high electrical conductivity.

Furthermore, it is preferable that the metallic particulates are present in the conductive resin compound in an amount of from 80 to 92.5 percent by weight, for practical use.

It is preferable that each metallic particulate in the conductive resin compound has an average diameter of from 0.2 to 20 $\mu$m, to provide a stable paste (coating material).

Furthermore, it is preferable that the average diameter of the through-hole filled with the conductive resin compound is from 50 to 300 $\mu$m, to maintain high electrical conductivity.

In addition, it is preferable that a circuit is formed both on the surface of the substrate and at the terminal of the conductive resin compound. As a result, it is easy to attain a circuit substrate using a haploid or a multilayer substrate. When using a multilayer substrate, the substrate can be combined flexibly as needed.

According to the second embodiment of the invention, a method of manufacturing a printed circuit board comprises the steps of: laminating both sides of an uncured resin impregnate fiber sheet substrate material having voids with cover films, forming through-holes in the substrate material in the thickness direction by laser irradiation, filling the through-holes with conductive paste, removing the cover films and applying a metal foil on at least one side of the substrate material, bonding the substrate material with the conductive paste by compressing and hardening the substrate material through heating and pressurization, and forming predetermined patterns on the metal foil. In this way, a circuit substrate can be produced efficiently. In particular, when laser irradiation is used for forming the through-holes, not only can precise and fine work be conducted, but also a clean production environment can be maintained without creating cutting scraps. This is an advantage over a conventional drilling method.

According to the above-noted embodiment, it is preferable that metal foil is applied on both sides of the substrate material. In this way, the substrate material can be used effectively either as a haploid substrate or as a component comprising a multilayer substrate.

Furthermore, it is preferable that the method of manufacturing a printed circuit board comprises the steps of: laminating both sides of an uncured resin impregnate fiber sheet substrate material having voids with cover films, forming through-holes in the substrate material i n the thickness direction by laser irradiation, filling the through-holes with conductive paste, removing the cover films, applying a metal foil on one side of each sheet, thereby forming two sheets of an intermediate, disposing the intermediates so that the sides with metal f oils face outside, positioning at least two layers of circuit substrates having circuit patterns in the core, bonding the substrate material with the conductive paste by compressing and hardening through heating and pressurization, and forming predetermined patterns on the metal foil. As a result, a multilayer substrate can be produced easily.

Furthermore, according to the above-noted example, it is preferable that a method of manufacturing a printed circuit board comprises the steps of: laminating both sides of an uncured resin impregnate fiber sheet substrate material having voids with cover films, forming through-holes in the substrate material in the thickness direction by laser irradiation, filling the through-holes with conductive paste, removing the cover films, thereby forming an intermediate connecting member, holding the intermediate connecting member between a plurality of double sided printed circuit boards, and bonding the substrate material with the conductive paste by compressing and hardening through heating and pressurization. As a result, a multilayer substrate can be produced easily.

Furthermore, it is preferable that the voids in the uncured resin impregnate fiber sheet substrate material are closed holes. Thus, even if the density of the through-hole is high, it does not mix with the conductive paste of an adjoining through-hole in a closed state so that a short circuit can be prevented effectively. It is also preferable that the closed hole has a diameter of from 5 to 20 $\mu$m in the uncured substrate material. When the conductive resin compound is impregnated in the substrate, an "anchor" effect with the conductive paste can be attained.

It i s preferable that the porosity of the uncured substrate material with holes is from 2 to 35%. This is practical since an "anchor" effect with the conductive paste can be attained.

It is preferable that the temperature of the substrate material during the heating step is from 170 to 260° C. When a thermosetting resin is used, a hardening reaction can be effectively conducted.

Furthermore, it is preferable that the pressure put on the substrate material during the compressing step is from 20 to 80 kg/cm$^2$. The substrate has effective properties by substantially diminishing air holes inside the substrate.

In addition, it is preferable that a part of fiber in the substrate material remains in the through-holes by laser irradiation. In this way, the conductive paste and the substrate material are bonded strongly.

It is preferable that a compound of metallic particulates and resin is used as the conductive resin compound to fill the through-holes, and that the resin which is one component of the conductive resin compound is bonded to the substrate through impregnation. In this way, the conductive paste and the substrate material can be bonded strongly.

Furthermore, according to the above-noted example, it is preferable that the resin which is one component of the conductive resin compound and the impregnate resin of the substrate belong to the resin having the same functional group, and that they are bonded to each other through covalent bonding and self-adhesion. In this way, the conductive paste and the substrate material can be bonded strongly. It is also preferable that the impregnate resin in the substrate and the resin which is one component of the conductive resin compound are both thermosetting resins, and further, that the resin comprises at least one resin selected from the group consisting of epoxy resin, thermosetting polybutadiene resin, phenol resin, and polyimide resin. Accordingly, the conductive paste and the substrate material can be bonded strongly, and in addition, the resin has excellent heat resistance.

Furthermore, it is preferable that a roll coating method is used to fill the conductive resin compound in the through-holes. This method enables filling easily by simply applying the conductive paste on top of the cover film (peeling film).

Additionally, it is preferable that the laser beam is selected from the group consisting of carbon dioxide laser, YAG laser, and excimer laser. By using this laser, the opening process can take place efficiently.

As described above, by filling the through-holes disposed in the uncured substrate material with closed voids and also filling the hollow-shaped part which is formed on the inner wall of the through-hole by opening the voids which are present inside the substrate material when the through-holes are formed, an "anchor" effect is increased, and the adhesion between the conductive paste and the wall surface of the through-hole is improved. In addition, since circuit patterns are disposed on top of the through-holes filled with the conductive paste, the contact area between the conductive paste and the metal foil is increased. As a result, a printed circuit board with excellent heat- and impact-resisting properties can be attained.

BRIEF DESCRIPTION OF THE FIGURES

FIGS. 5 (a) to 5 (h) are cross-sectional views explaining a method of manufacturing a printed circuit board of an embodiment of this invention.

FIGS. 6 (a) to 6 (e) are cross-sectional views explaining a method of manufacturing a printed circuit board of an embodiment of this invention.

FIGS. 8 (a) to 8 (e) are cross-sectional views explaining a method of manufacturing a conventional double sided printed circuit board.

DETAILED DESCRIPTION OF THE INVENTION

This invention will be described by referring to the following illustrative examples and attached figures.

EXAMPLE 1

Figure 1:
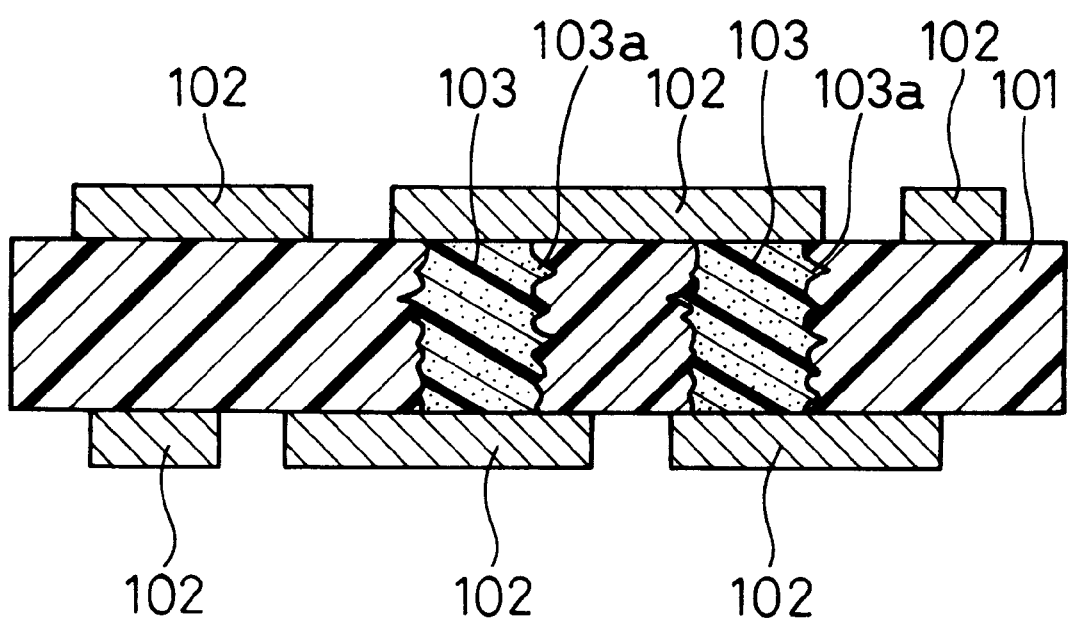
FIG. 1 is a cross-sectional view of a first embodiment of this invention showing a circuit board.
Figure 2:
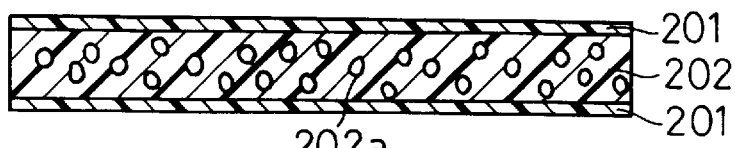
FIGS. 2 (a) to 2 (g) are cross-sectional views explaining a method of manufacturing a circuit board of an embodiment of this invention.
Figure 2:
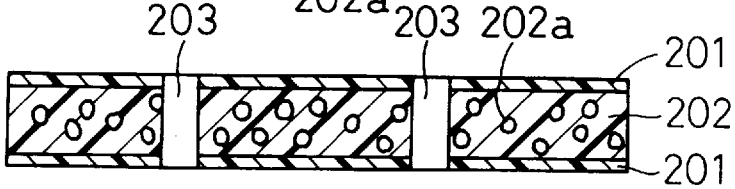
Figure 2:
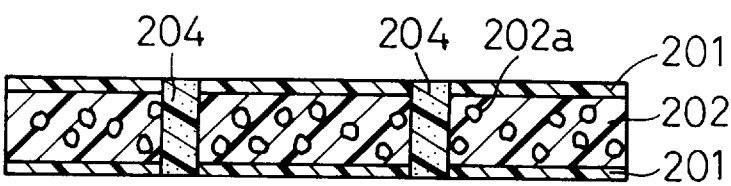
Figure 2:
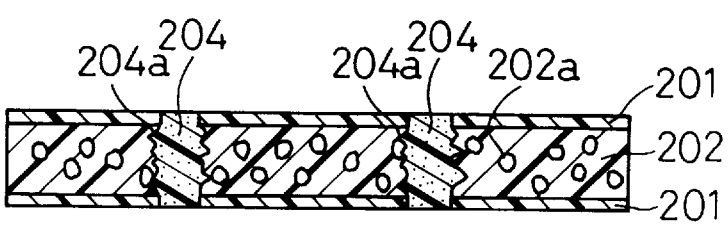
Figure 2:
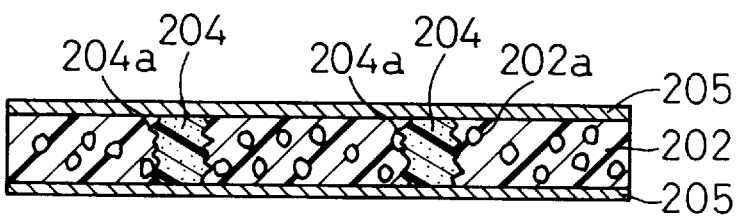
Figure 2:
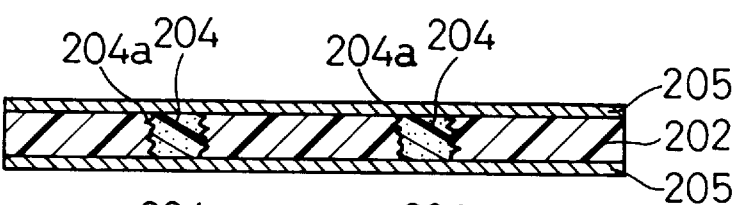
Figure 2:
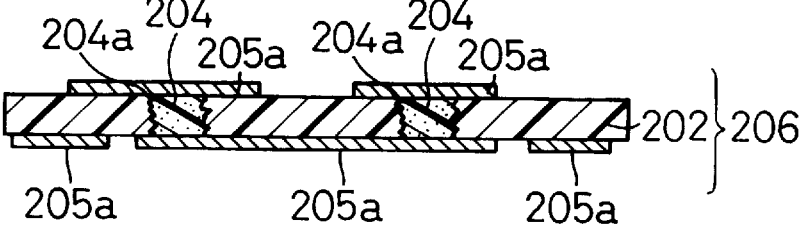

FIG. 1 is a cross-sectional view of one embodiment of this invention showing a circuit substrate. FIGS. 2 (a) to 2 (e) are cross-sectional views explaining a method of manufacturing a circuit substrate. As shown in FIG. 1, a circuit substrate of this embodiment comprises an insulating substrate 101 formed by compressing and hardening a porous base material impregnated with thermosetting resin through heating and pressurization, circuit patterns 102 formed by etching metal foil adhered on the porous base material through heating and pressurization, conductive paste 103 filled into through-holes disposed in the porous base material, and a part of binder resin 103a in conductive paste 103 which is impregnate in the porous base material.

With reference to FIG. 2 (a), the above-mentioned circuit substrate comprises a porous base material 202 of 180 $\mu$m in thickness which is provided with protective films 201 made of polyethylene terephthalate or the like on both sides with a thickness of 12 $\mu$m. Porous base material 202 used here was a base material having small holes or voids 202a in the inside, for example, a base material consisting of a composite material prepared by impregnating thermosetting epoxy resin (e.g. "EPON1151B60" manufactured by Shell) into a nonwoven fabric of aromatic polyamide (aramid) fibers (e.g. "Kevlar" manufactured by Dupont, fineness: 1.5 denier, length: 7 mm, METSUKE: 70 g/m$^2$). This base material is hereinafter referred to as aramid-epoxy sheet. The ratio in volume of voids 202a to aramid-epoxy sheet 202 is 40%.

Subsequently, as shown in FIG. 2 (b), through-holes 203 of 200 $\mu$m in diameter were formed at predetermined places in aramid-epoxy sheet 202 by utilizing a laser processing method such as with a carbon dioxide laser.

Next, as shown in FIG. 2 (c), through-holes 203 were filled with conductive paste 204. It is to be noted here that conductive paste 204 is composed of copper powder with an average particulate diameter of 2 μm as the conductive substance and epoxy resin of non-solvent type as the binder resin. The conductive paste was prepared by mixing and kneading the copper powder and the binder resin in three roles, with the content of the copper powder set at 85 wt %. For filling conductive paste 204, aramid-epoxy sheet 22 having through-holes 203 was placed on a table of a printing machine (not shown), and conductive paste 204 was directly printed from above protective films 201. It is possible to use a roll decalcomania or the like as the printing method. In this case, protective film 201 on the upper surface plays the part of a printing mask and also prevents the surface of aramid-epoxy sheet 202 from soiling. At this stage, a part of binder resin 204a in conductive paste 204 had already penetrated into the side of aramid-epoxy sheet 202, and a composition ratio of the conductive substance to the binder resin increased gradually in conductive paste 204 (FIG. 2(d)). After that, protective films 201 were separated from both sides of aramid-epoxy sheet 202.

Then, as shown in FIG. 2 (e), copper foil of 35 μm in thickness was applied on both sides of aramid-epoxy sheet 202 as metal foil 205. Through heating and pressurization in this state, aramid-epoxy sheet 202 was compressed, and at the same time, aramid-epoxy sheet 202 and metal foil 205 were adhered, as shown in FIG. 2 (f). In this case, conditions for the heating and pressurization are such that the temperature was raised from room temperature up to 200° C. in 30 minutes while applying pressure of 60 kgf/cm² in vacuum. The temperature was held at 200° C. for 60 minutes and subsequently lowered down to room temperature in 30 minutes. The conductive paste was also compressed during this process, and the binder component was pressed out between the conductive substances, thereby strengthening the binding among the conductive substances and the binding between the conductive substances and the binding between the conductive substance and the metal foil. The conductive substance within conductive paste 24 was compacted, and at the same time, epoxy resin which is one component of aramid-epoxy sheet 22, conductive paste 204, and binder component 204a of conductive paste 204 impregnated into aramid-epoxy sheet 202 cured or hardened. At this moment, the content of the conductive substance contained in the conductive paste 204 raised up to 92.5 wt %. Moreover, the porosity of the voids 202a in porous base material 202 was reduced to 0 to 1 vol. % through heating and pressurization, and the size of the voids 202a also became smaller.

Lastly, metal foils 205 were formed into circuit patterns 205a by using a usual etching method, as shown in FIG. 2 (g). In the manner as described above, a circuit board 206 was obtained.

It was possible to confirm the phenomenon of the binder component contained in conductive paste 204 penetrating into porous base material 202 by replacing a part of the binder with dye and filling it into through-holes 203. Binder component 204a contained in conductive paste 204 which had penetrated into porous base material 202 hardened, and therefore, the boundary face between conductive paste 204 and porous base material 202 was bonded strongly. Furthermore, by choosing the binder component contained in conductive paste 204 from the resin which has the same component with the thermosetting resin contained in porous base material 202, or by choosing the binder component which reacts and hardens against the thermosetting resin contained in porous base member 202, the impregnated part of the binder resin and the thermosetting resin contained in the porous base material are bonded chemically so that the anchor effect of the impregnated part of the binder resin became greater.

EXAMPLE 2

A method of manufacturing a multilayer circuit substrate according to one embodiment of this invention will be described by referring to the figures.

Figure 3:
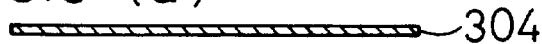
FIGS. 3 (a) to 3 (h) are cross-sectional views explaining a method of manufacturing a multilayer circuit board of an embodiment of this invention.
Figure 3:
Figure 3:
Figure 3:
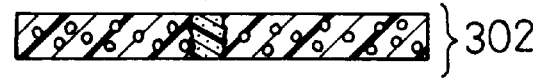
Figure 3:
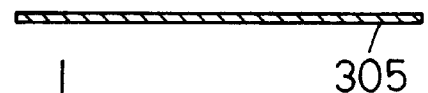
Figure 3:
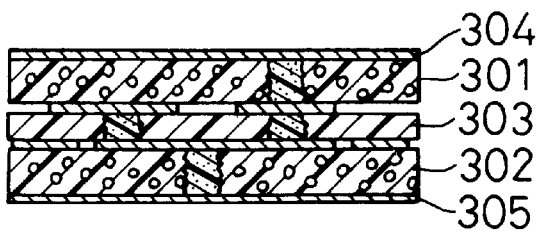
Figure 3:
Figure 3:
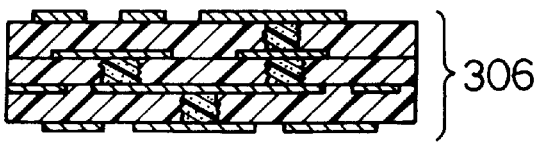

FIGS. 3 (a) to (h) are cross-sectional views showing a method of manufacturing a multilayer circuit substrate in one embodiment of the invention. In these figures, 3 (a) and 3 (e) denote a first and a second metal foil; 3 (b) and 3 (d), a first and a second intermediate connecting member; and 3 (c), a circuit substrate. FIGS. 3 (f) to (h) show a method of forming a multilayer circuit substrate by first disposing the circuit substrate between the first and the second intermediate connecting members, laminating the upper and lower sides with the first and the second metal foils, and forming patterns on the first and the second metal foils.

Firstly, circuit substrate 303 (substantially equivalent to circuit substrate 206) was prepared which had been manufactured by the method shown in FIGS. 2 (a) to (g) of the above-mentioned first embodiment (FIG.3 (c)). Then, besides circuit substrate 303, a first intermediate connecting member 301 (FIG. 3 (b)) and a second intermediate connecting member 302 (FIG. 3 (d)) were prepared according to a method shown in FIGS. 2 (a) to (d) which had been seperated from protective films. In FIGS. 3(a) and 3(e), 304 and 305 denote metal foils (copper foil).

As shown in FIG. 3 (f), circuit substrate 303 was placed in a predetermined position between the first intermediate connecting member 301 and the second intermediate connecting member 302, and the first metal foil 304 and the second metal foil 304 were laminated on its upper and lower sides. Then, as shown in FIG. 3 (g), circuit substrate 303 and metal foils 304, 305 were adhered via intermediate connecting members 301 and 302 through heating and pressurization. Metal foil 304 and 305 were formed into circuit patterns by using a usual etching method. In this way, a multilayer circuit board consisting of four layers was obtained. The number of layers can be increased by replacing circuit substrate 303 in FIG. 3 (c) with multilayer circuit board 306 and repeating the laminating procedure shown in FIGS. 3 (a) to (h).

Another method of forming a multilayer circuit board further comprises holding an intermediate connecting member between a plurality of circuit substrates, and then, heating and pressurizing.

EXAMPLE 3

Figure 4:
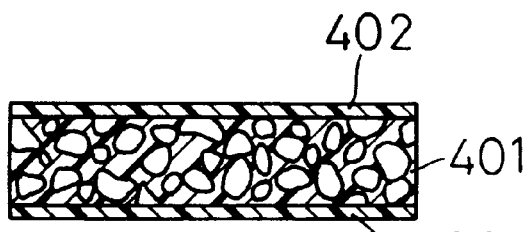
FIGS. 4 (a) to 4 (f) are cross-sectional views explaining a method of manufacturing a printed circuit board of an embodiment of this invention.
Figure 4:
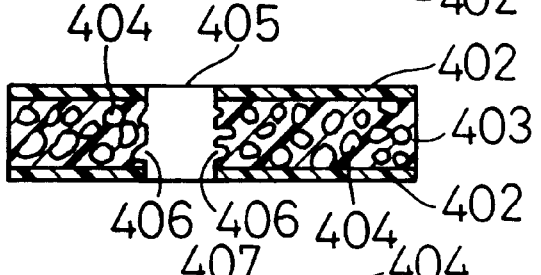
Figure 4:
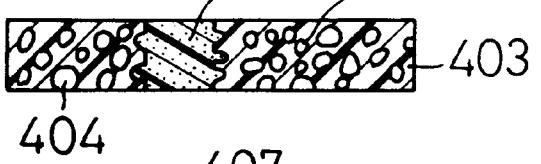
Figure 4:
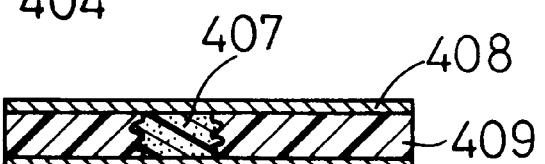
Figure 4:
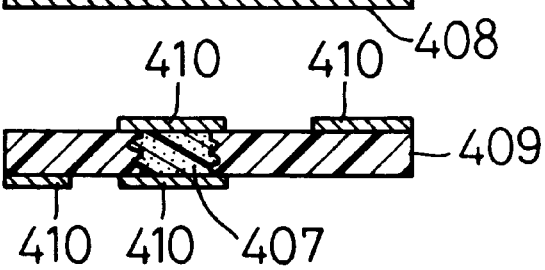

FIGS. 4 (a) to (f) are cross-sectional views showing a method of manufacturing a printed circuit board in another embodiment of this invention. Referring to FIGS. 4 (a) to (f), reference numeral 401 denotes a porous base material; 402, a tackfree film; 403, an uncured substrate material having closed voids; 404, voids; 405, a through-hole; 406, hollow-shaped parts; 407, conductive paste; 408, metal foils; and 409, an insulating layer; 410, circuit patterns. In this embodiment, the size and the rate of the voids contained in porous base material 401 were controlled by using the compressibility so that it was preferable to use a sheet-type laminated substance characterized by compressibility in heated and pressurized conditions as porous base material 401 shown in FIG. 4 (a). In this case, a composite material consisting of aromatic polyamide which is a nonwoven fabric impregnated with thermosetting resin and epoxy resin was used. FIG. 4 (b) shows the state in which porous base material 401 shown in FIG. 4 (a) is compressed at the fixed rate in the thickness direction by preliminary heating and pressurization and formed into an uncured substrate material having closed voids 403 whose size and rate are controlled. FIG. 4 (c) shows the state in which uncured substrate material having closed voids 403 shown in FIG. 4 (b) and tackfree film 402 are disposed with through-hole 405. When through-hole 405 was formed, voids 404 contained in uncured substrate material having closed voids 403 opened and formed a plurality of hollow-shaped parts 406 on the inner wall of through-hole 405. It is possible to form through-hole 405 and hollow-shaped parts 406 by utilizing a drilling processing or other kinds of laser processing methods. The most suitable processing method in this embodiment was using a carbon dioxide laser.

FIG. 4 (d) shows the state in which through-hole 405 and a plurality of hollow-shaped parts 406 formed on the inner wall of the through-hole which were made in uncured substrate material having closed voids 403 are first filled with conductive paste 407 via tackfree films 402, and tackfree films 402 are seperated afterwards. FIG. 4 (e) shows the state in which FIG. 4 (d) applied with metal foils 408 on the upper and lower sides is subjected to heating and pressurization, thereby hardening the thermosetting resin, and the metal foils are electrically connected via conductive paste 407. Uncured substrate material having closed voids 403 is further compressed until voids 404 contained in the substrate disappear, finally forming insulating layer 409. However, a plurality of hollow-shaped parts 406 formed on the inner wall of the through-hole do not disappear since they are filled with conductive paste 407. Accordingly, the adhesion between conductive paste 407 and the wall surface of through-hole 405 improves by the increased anchor effect, and thus, a printed circuit board with excellent heat- and impact-resistance is obtained. FIG. 4 (f) shows that metal foils 408 on the surface were etched into a double sided printed circuit board.

EXAMPLE 4

A method of manufacturing a multilayer printed circuit board according to another embodiment of this invention will be described by referring to the figures.

FIGS. 5 (a) to (h) are cross-sectional views showing a method of manufacturing a multilayer printed circuit board in one embodiment of the invention. Referring to FIGS. 5 (a) to (h), reference numeral 501 denotes a first metal foil; 502, a second metal foil; 503, an uncured substrate material having closed voids; 504, voids; 505, conductive paste; 506, a second circuit pattern; 507, a third circuit pattern; 508, an insulating layer; 509 and 510, a first and second intermediate connecting member used for laminating and interconnecting the metal foils with a double sided printed circuit board; 511, a double sided printed circuit board; 512, a first circuit pattern; 513, a fourth circuit pattern; and 514, a multilayer printed circuit board consisting of four layers.

Furthermore, FIGS. 5 (f) to (h) show a process of forming a multilayer printed circuit board by placing double sided printed circuit board 511 between first intermediate connecting member 509 and second intermediate connecting member 510, and then, laminating the upper and lower sides with first metal foil 501 and second metal foil 502, and finally forming first metal foil 501 and second metal foil 502 into circuit patterns of the multilayer printed circuit board. As for intermediate connecting members 509 and 510, the uncured substrate material having closed voids manufactured in the method shown in FIGS. 4 (a) to (d) was used which was filled with the conductive paste in the through-hole and in the plurality of hollow-shaped parts formed on the inner wall of the through-hole.

As shown in FIG. 5 (f), double sided printed circuit board 511 was placed in a predetermined position between first intermediate connecting member 509 and second intermediate connecting member 510, and first metal foil 501 the second metal foil 502 were laminated on its upper and lower sides. Then, as shown in FIG. 5 (g), double sided printed circuit board 511 and first and second metal foils 501 and 502 were adhered via intermediate connecting members 509 and 510 through heating and pressurization. At the same time, first metal foil 501 was electrically connected to second circuit pattern 506, and the second metal foil 502 was connected to third circuit pattern 507. During this process, second circuit pattern 506 encroached on first intermediate connecting member 509 and third circuit pattern 507 encroached on second intermediate connecting member 510, forming the internal layer structure as shown in FIG. 5 (g). Subsequently, first metal foil 501 and second metal foil 502 were etched into first circuit pattern 512 and fourth circuit pattern 513. Thus, a multilayer printed circuit board consisting of four layers 514 was obtained as shown in FIG. 5 (h).

Furthermore, the number of layers could be increased easily by replacing double sided printed circuit board 511 of FIG. 3 (c) in the process of FIG. 5 (a) to (h) with a multilayer printed circuit board.

EXAMPLE 5

A method of manufacturing a multilayer printed circuit board according to another embodiment of this invention will be described by referring to the figures.

FIGS. 6 (a) to (e) are cross-sectional views showing a method of manufacturing a multilayer printed circuit board in one embodiment of the invention. Referring to FIGS. 6 (a) to (e), reference numeral 601 denotes a first circuit pattern; 602, a second circuit pattern; 603, conductive paste; 604, an insulating layer; 605, a third circuit pattern; 606, a fourth circuit pattern; 607, voids; 608, an uncured substrate material having closed voids; 609 and 610, a first and a second double sided printed circuit board; 611, an intermediate connecting member used for laminating and interconnecting first double sided printed circuit board 609 with second double sided printed circuit board 610; and 612, a multilayer printed circuit board consisting of four layers.

FIGS. 6 (d) and (e) show a method of manufacturing a multilayer printed circuit board by laminating first double sided printed circuit board 609 with second double sided printed circuit board 610 via intermediate connecting member 611. As for intermediate connecting member 611, the uncured substrate material having closed voids manufactured in the method shown in FIGS. 4 (a) to (d) was used which was filled with the conductive paste in the through-hole and the plurality of hollow-shaped parts formed on the inner wall of the through-hole. As shown in FIG. 6 (d), intermediate connecting member 611 was laminated on top of second double sided printed circuit board 610, and first double sided printed circuit board 611 was laminated thereon. Next, as shown in FIG. 6 (e), first double sided printed circuit board 609 and second double sided printed circuit board 610 were adhered through heating and pressurization. At the same time, second circuit pattern 602 and third circuit pattern 605 were electrically connected via conductive paste 603. During this process, first circuit pattern 601 and fourth circuit pattern 606 encroached on insulating layer 604, and second circuit pattern 602 encroached on intermediate connecting member 608, thereby smoothing the outside layers. In this way, multilayer printed circuit board 612 consisting of four layers was obtained.

Furthermore, in order to manufacture a multilayer printed circuit board consisting of more layers, it is possible to attain this by first preparing a necessary number of double sided printed circuit boards and intermediate connecting members to connect among those boards. After the intermediate connecting members are inserted between each double sided printed circuit board, the whole assembly can be laminated at once through heating and pressurization. The same result can be attained by replacing the double sided printed circuit board of FIG. 6 (a) or (b) with a multilayer printed circuit board.

EXAMPLE 6

In this embodiment, the bonding of the substrate material with the conductive resin compound will be described by referring to the figures.

Figure 7:
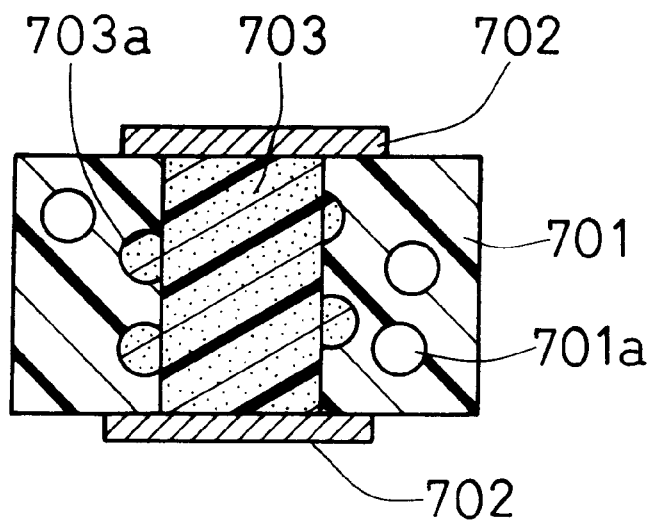
FIGS. 7 (a) to 7 (c) are schematic views showing bonding substrate material and a conductive resin compound of an embodiment of this invention.
Figure 7:
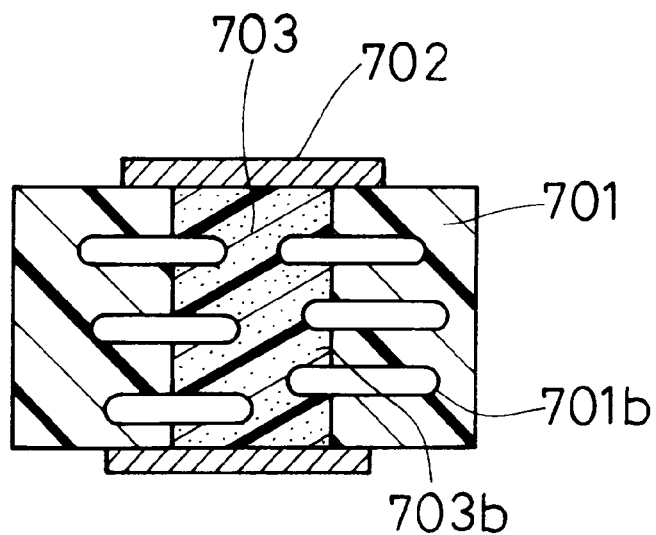
Figure 7:
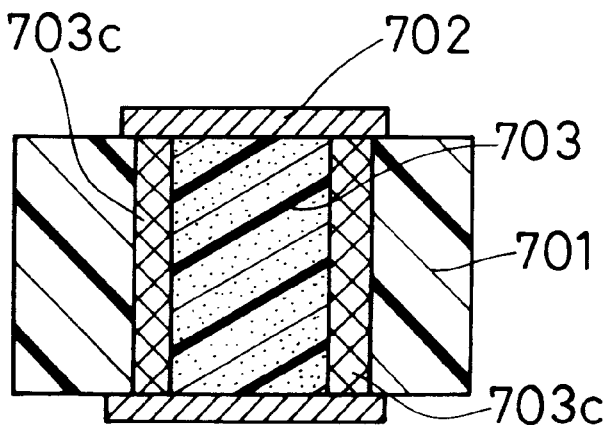

FIG. 7 (a) is a schematic cross-sectional view showing a sheet 701 disposed with copper foils 702 on both sides before being compressed. A porous base material used here is an aramid-epoxy sheet 701 of 200 μm in thickness, and polyethylene terephthalate films of 12 μm in thickness were used as tackfree films provided on both sides. This was preliminary heated and pressurized two minutes with press temperature of 100° C. and pressure 30 kg/cm by using heat pressing to form an uncured substrate material having closed voids 701a. Carbon dioxide laser was used to form through-hole 703 of 0.2 mm in diameter. At the same time, a plurality of hollow-shaped parts 703a were formed in a part (inner wall of the through-hole) of closed voids 701a. Through-hole 703 and the plurality of hollow-shaped parts 703a formed on the inner wall of the through-hole were filled with conductive paste composed of dispersing silver powder as metallic particles into epoxy resin of non-solvent type. As a result, by filling hollow-shaped part 703a with the conductive paste, the anchor effect increases, thereby enhancing the adhesion between the conductive paste and the wall surface of the through-hole.

FIG. 7 (b) is another schematic cross-sectional view showing sheet 701 disposed with copper foils 702 on both sides before being compressed. The same porous base material was used as mentioned above. When irradiated energy from the carbon dioxide laser is low, fiber composing sheet 701 remains partially in through-hole 703 and sticks out. By filling through-hole 703 in this condition with the conductive paste, a surrounding part 703b of composite fiber 701b is also filled with the conductive paste. Thus, the anchor effect increases, thereby enhancing the adhesion between the conductive paste and the wall surface of the through-hole.

FIG. 7 (c) is another schematic cross-sectional view showing sheet 701 disposed with copper foils 702 on both sides before being compressed. The same porous base material was used as mentioned above. Provided that reciprocal solubility between a resin compound in the conductive paste and a resin compound in the base material sheet is good, the resin compound in the conductive paste impregnates into the base material side when the conductive paste is filled into through-hole 703. Thus, a mixed layer 703c can be formed. The presence of mixed layer 703c enhances the adhesion between the conductive paste and the wall surface of the through-hole. Furthermore, the concentration of the conductive compound (for example metallic particulates) in the conductive paste becomes higher, thereby improving the conductivity.

EXAMPLE 7

In this embodiment, a porous base material is an aramid-epoxy sheet of 200 μm in thickness, and polyethylene terephthalate films of 4 to 50 μm in thickness were used as tackfree films provided on both sides. This was preliminarily heated and pressurized two minutes with press temperature of 100° C. and pressure of 5 to 50 kg/cm$^2$ by using heat pressing to form an uncured base material having closed voids. A carbon dioxide laser was used to form a through-hole of 0.2 mm in diameter. At the same time, a plurality of hollow-shaped parts were formed on the inner wall of the through-hole by opening voids contained in the uncured base material having closed voids. Then, this through-hole and the plurality of hollow-shaped parts formed on the inner wall were filled with conductive paste composed of dispersing silver powder as metallic particles into epoxy resin of non-solvent type. After that, the tackfree films were separated, and copper films of 35 μm in thickness were applied on both sides. This was preliminarily heated and pressurized one hour with press temperature of 170° C. and pressure of 30 kg/cm$^2$ by using heat pressing to form a double sided copper plate. After being formed in the manner mentioned above, the copper foil layer was formed into circuit patterns by using a usual etching method, and accordingly, a double sided printed circuit board was produced.

Figure 9:
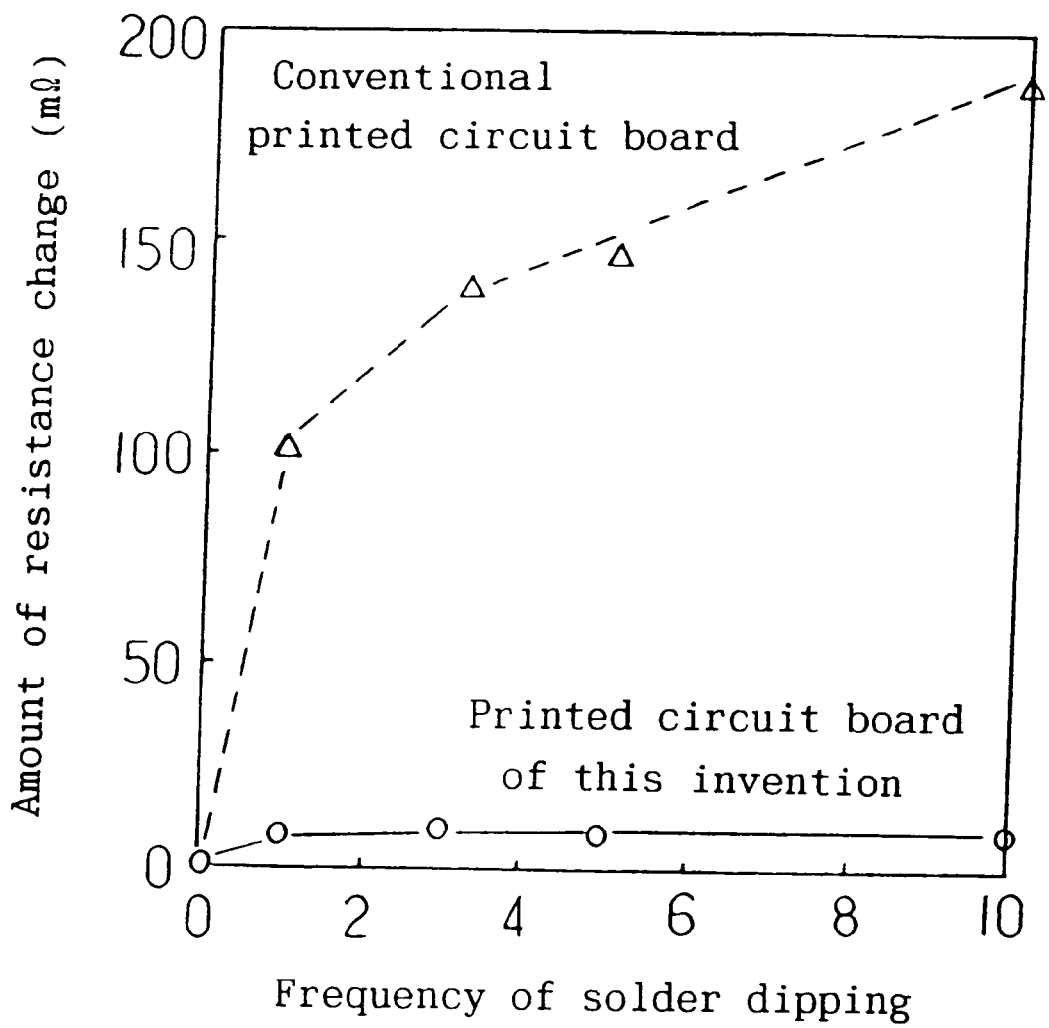
FIG. 9 is a graph showing results of a dipping test of a printed circuit board of an embodiment of this invention.

FIG. 9 shows the results of solder dipping (reflow) tests conducted to the printed circuit board obtained in the manufacturing method of this embodiment. The ordinate in FIG. 9 shows an amount of connection resistance change per via 500 holes before and after the solder dipping, and the abscissa shows a frequency of the solder dipping. For comparative purpose, the results of tests conducted to a conventional printed circuit board are also shown. As the frequency of the solder dipping increased, there was hardly any change in the amount of connection resistance in case of the printed circuit board of this embodiment, whereas the amount of connection resistance increased remarkably in case of the conventional printed circuit board.

Figure 10:
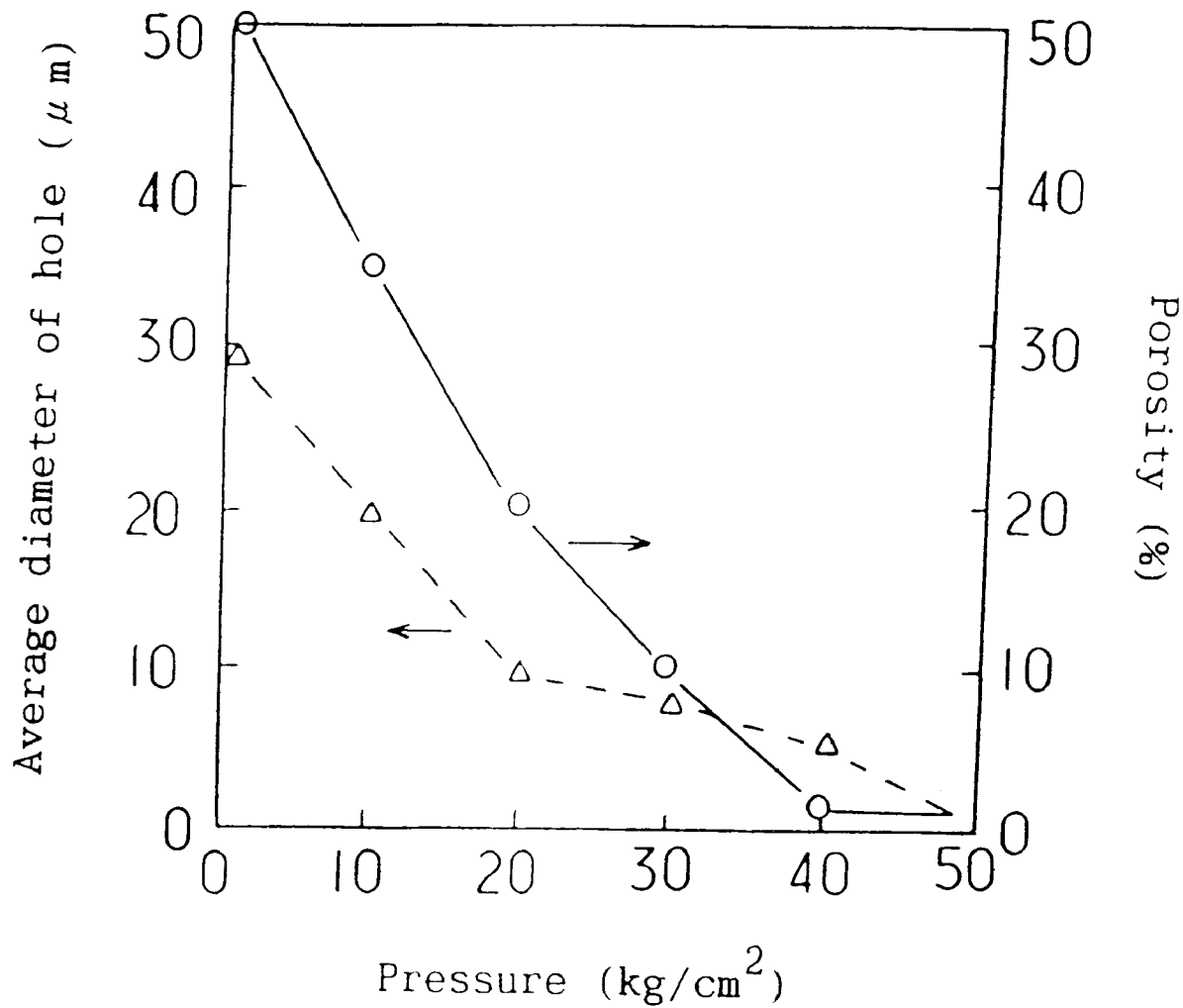
FIG. 10 is a graph showing the relationship between pressure for compressing a porous substrate material, the average hole diameter and the porosity in the uncured substrate material with closed holes of an embodiment of this invention.

FIG. 10 shows the relationship between pressure, average hole diameter and porosity of an uncured substrate material having closed voids when a porous base material was formed to the uncured substrate material having closed voids through heating and pressurization in this embodiment. With the increase in pressure, the average hole diameter and porosity decreased.

Figure 11:
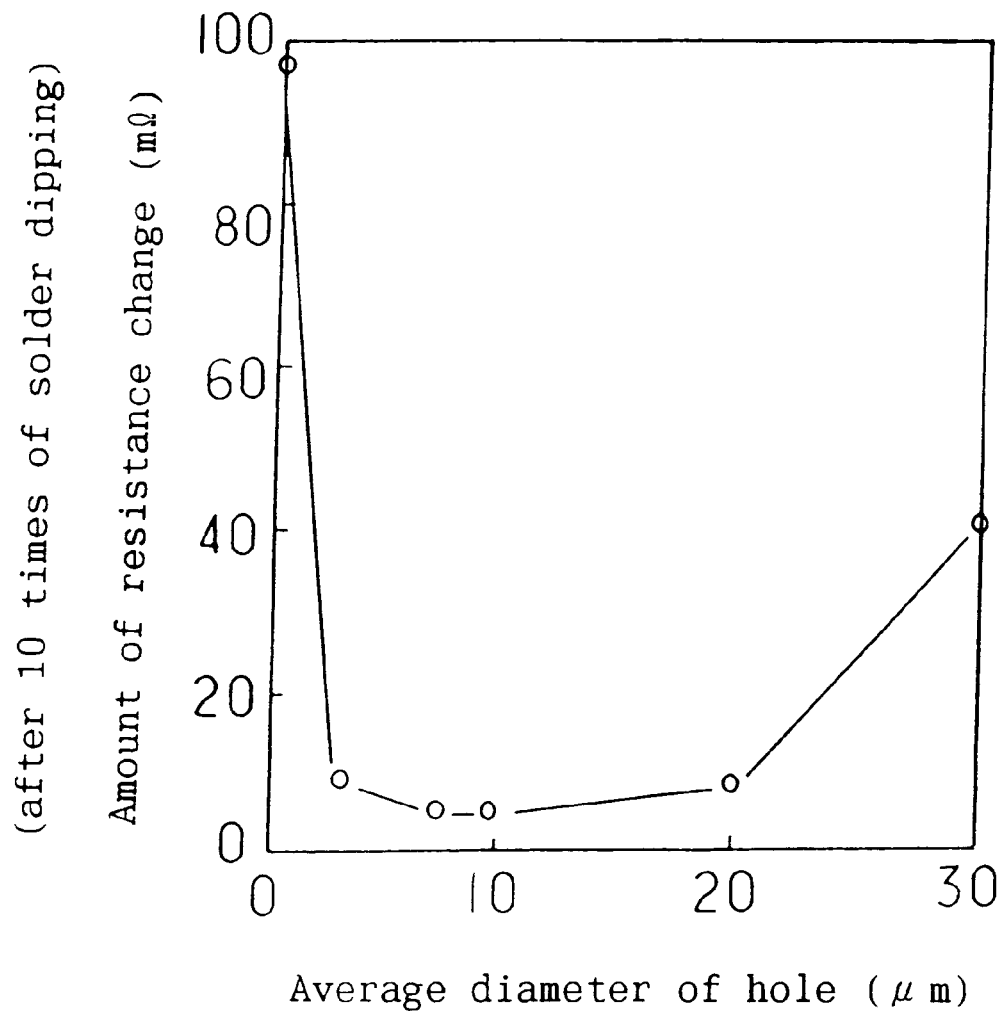
FIG. 11 is a graph showing the relationship between the average hole diameter in the uncured substrate material with closed holes and amount of resistance change due to solder dipping of a printed circuit board of an embodiment of this invention.

FIG. 11 shows the relationship between average hole diameter of an uncured substrate material having closed voids and amount of connection resistance change due to a solder dipping of a printed circuit board. The ordinate in FIG. 11 shows an amount of connection resistance change per via 500 holes before and after the solder dipping, and the abscissa shows average hole diameter. High reliability was attained when the average hole diameter was 5 to 20 μm.

Figure 12:
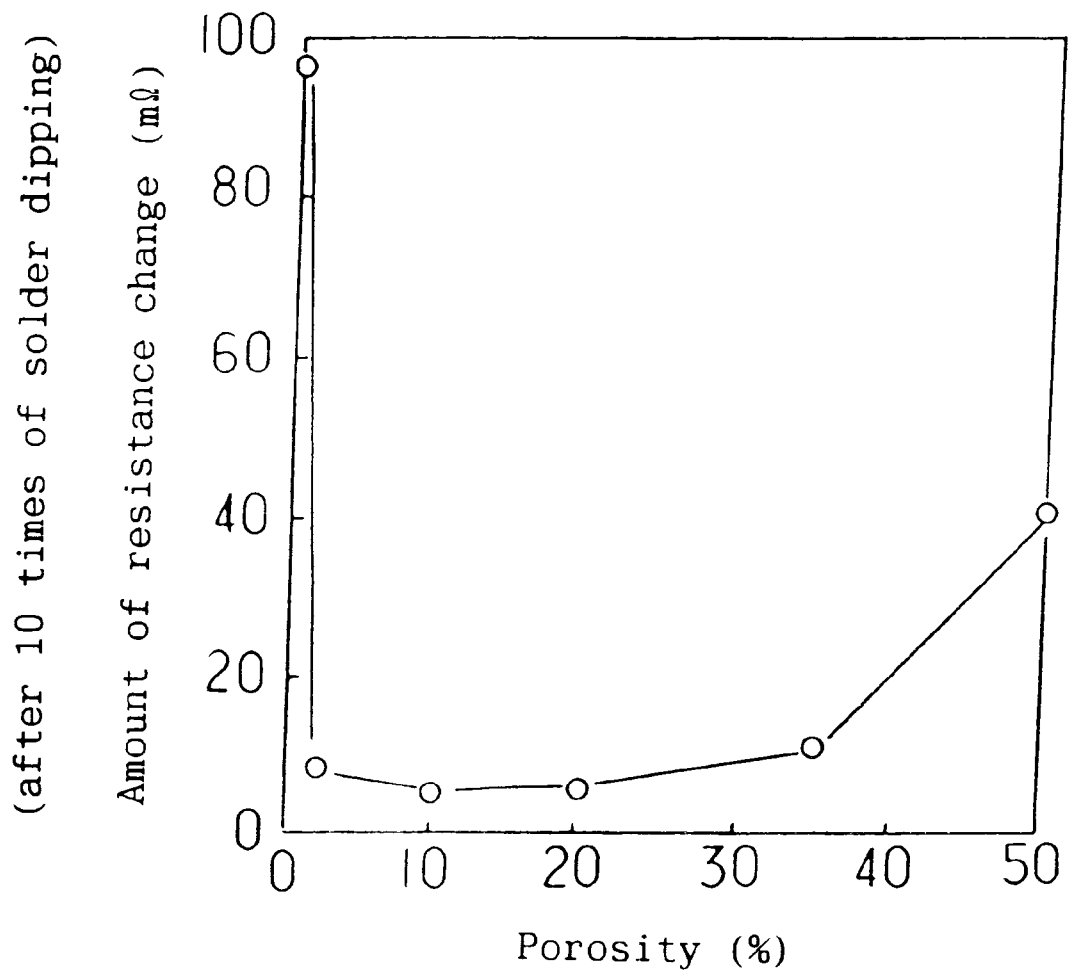
FIG. 12 is a graph showing the relationship between the porosity in the uncured substrate material with closed holes and amount of resistance change due to solder dipping of a printed circuit board of an embodiment of this invention.

FIG. 12 shows the relationship between porosity of an uncured substrate material having closed voids and amount of connection resistance change due to a solder dipping of a printed circuit board. The ordinate in FIG. 12 shows amount of connection resistance change per via 500 holes before and after the solder dipping, and the abscissa shows the porosity. High reliability was attained when the porosity was 2 to 35%.

With regard to the conductive substance contained in the conductive paste of this embodiment, high reliability could be attained when metallic particles used were at least one metal selected for the group consisting of gold, silver, copper, palladium, nickel and an alloy thereof.

EXAMPLE 8

In this embodiment, the metal foil was copper foil of 35 μm in thickness, and a double sided printed circuit board was used as the printed circuit board, as in Example 1. As for an intermediate connecting member, an aramid-epoxy sheet was used which comprises a through-hole of 0.2 mm and hollow-shaped parts on the inner wall of the through-hole which were filled with the conductive paste described in Example 1. Intermediate connecting members were disposed above and below the double sided printed circuit board, and copper foil was applied above and below. Then, this was heated and pressurized for one hour with a press temperature of 170° C. and a pressure of 30 kg/cm$^2$ by using heat pressing to form a laminated layer. Next, the copper foils were formed into patterns by a conventional etching method, thereby manufacturing a four-layer printed circuit board.

Figure 13:
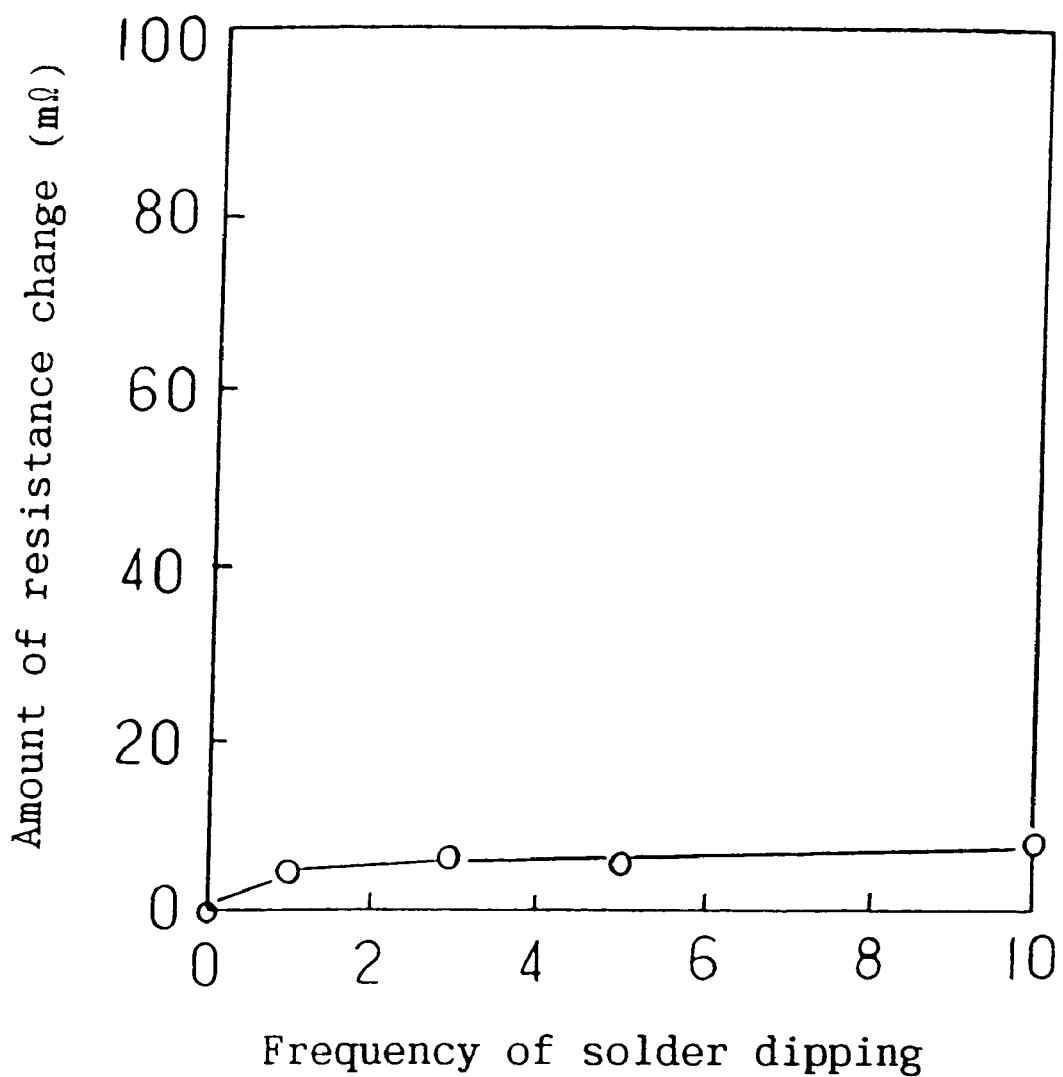
FIG. 13 is a graph showing results of a solder dipping test of a multilayer printed circuit board of an embodiment of this invention.

FIG. 13 shows the results of solder dipping tests conducted to the multilayer printed circuit board obtained in the manufacturing method of this embodiment. The ordinate in FIG. 13 shows the amount of connection resistance change per 500 holes before and after the solder dipping, and the abscissa shows the frequency of the solder reflow. As for the multilayer printed circuit board of this embodiment, there was hardly any change found in the amount of connection resistance due to the solder dipping.

EXAMPLE 9

In this embodiment, a double sided printed circuit board was used, and the printed circuit board was manufactured as in Example 1, and an intermediate connecting member was an aramid-epoxy sheet which comprises a through-hole of 0.2 mm and hollow-shaped parts on the inner wall of the through-hole which were filled with the conductive paste described in the first embodiment. The double sided printed circuit boards were disposed above and below the intermediate connecting member, and then, this was heated and pressurized one hour with press temperature of 170° C. and pressure of 30 kg/cm$^2$ by using heat pressing to manufacture a four-layer printed circuit board.

Figure 14:
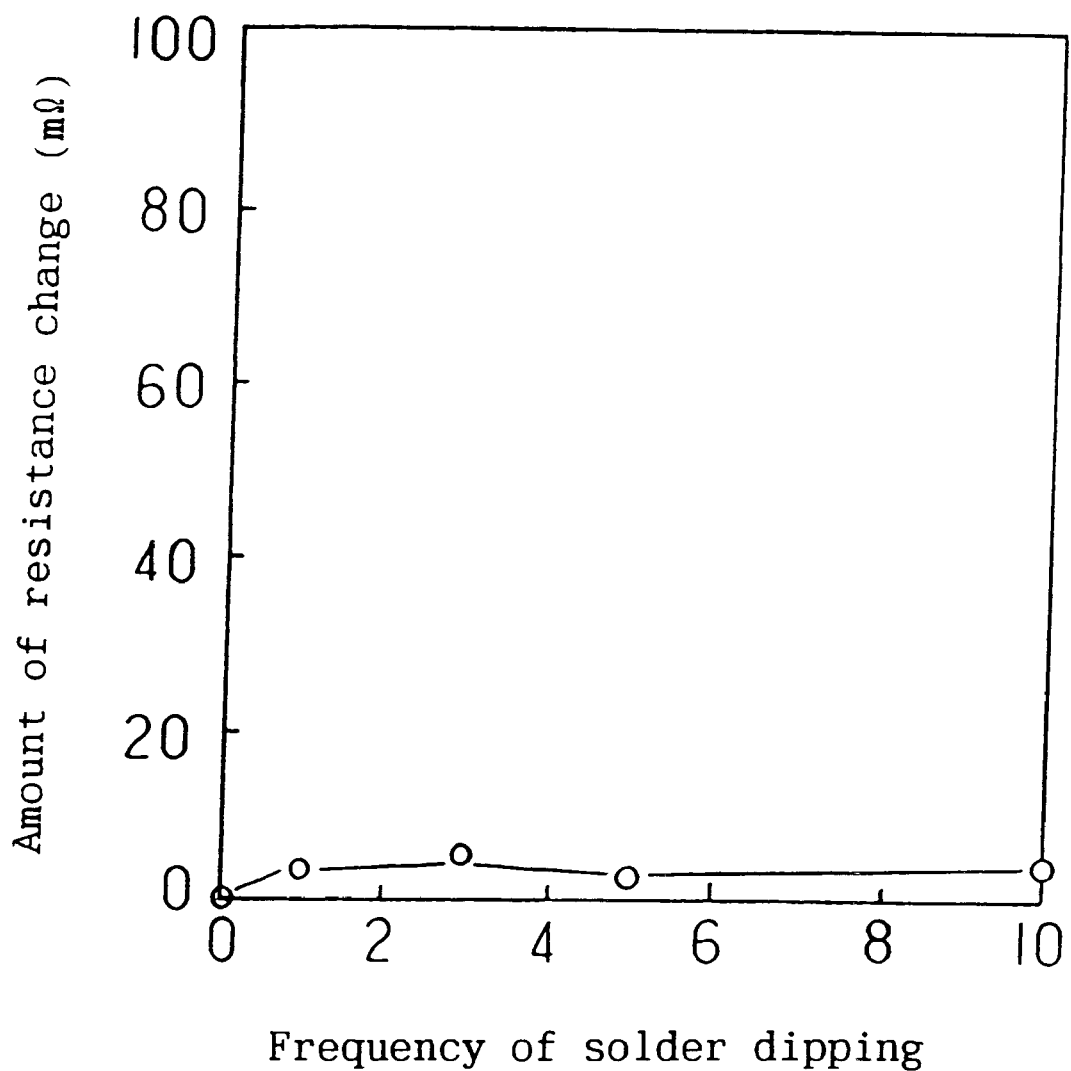
FIG. 14 is a graph showing the results of a solder dipping test of a multilayer printed circuit board of an embodiment of this invention.

FIG. 14 shows the results of solder dipping tests conducted to the multilayer printed circuit board obtained in the manufacturing method of this embodiment. The ordinate in FIG. 14 shows the amount of connection resistance change per 500 holes before and after the solder dipping, and the abscissa shows a frequency of the solder dipping. As for the multilayer printed circuit board of this embodiment, there was hardly any change found in the amount of connection resistance due to the solder dipping.

With respect to the double sided printed circuit boards in the above-mentioned Examples 1 to 9, it is also possible to use a compound material of glass fiber and epoxy resin or a compound material of glass fiber and polyimide resin or a compound material of glass fiber and thermosetting polybutadiene resin (BT resin) in addition to the printed circuit board manufactured in Example 1. Furthermore, as for a conductive substance contained in the conductive paste, the same results could be attained when metallic particles used were at least one metal selected from the group consisting of gold, silver, copper, palladium, nickel, and an alloy thereof.

EXAMPLE 10

Monolayer substrates were opened by processing using carbon dioxide laser which consisted of 8 kinds of composites: an aramid woven fabric plus phenol resin, epoxy resin, BT resin, and polyimide which are all of thermosetting and uncured nature, and an aramid nonwoven fabric plus phenol resin, epoxy resin, BT resin, and polyimide which are all of thermo-setting and uncured nature. Tables 1-1, 1-2 show the conditions of laser processing, the hole diameter in each case, and the constitution of the holes in 8 kinds of monolayer substrates.

TABLE 1-1

Opening and processing conditions and results by carbon dioxide laser

| Sample No. | Fiber | Impregnate resin | Energy density (mJ/cm$^2$) | Beam size (μm) | Hole size (μm) | Maximum penetration amount of base material into holes (μm) |
|---|---|---|---|---|---|---|
| 1 | aramid | epoxy | 10.0 | 80 | 110 | 14 |
| 2 | woven | | 13.5 | 170 | 200 | 17 |
| 3 | fabric | | 16.0 | 250 | 290 | 19 |
| 4 | | phenol | 10.0 | 80 | 100 | 11 |
| 5 | | | 13.5 | 170 | 190 | 14 |
| 6 | | | 16.0 | 250 | 280 | 17 |
| 7 | | BT | 10.0 | 80 | 90 | 14 |
| 8 | | | 13.5 | 170 | 200 | 18 |
| 9 | | | 16.0 | 250 | 270 | 22 |
| 10 | | polyimide | 10.0 | 80 | 100 | 10 |
| 11 | | | 13.5 | 170 | 200 | 12 |
| 12 | | | 16.0 | 220 | 250 | 15 |
| 13 | aramid | epoxy | 10.0 | 80 | 100 | 12 |
| 14 | non- | | 13.5 | 170 | 200 | 16 |
| 15 | woven | | 16.0 | 250 | 280 | 18 |
| 16 | fabric | phenol | 10.0 | 80 | 110 | 11 |
| 17 | | | 13.5 | 170 | 205 | 17 |
| 18 | | | 16.0 | 250 | 280 | 21 |
| 19 | | BT | 10.0 | 80 | 95 | 14 |
| 20 | | | 13.5 | 170 | 190 | 16 |
| 21 | | | 16.0 | 250 | 280 | 17 |
| 22 | | polyimide | 10.0 | 80 | 100 | 10 |
| 23 | | | 13.5 | 170 | 185 | 12 |
| 24 | | | 16.0 | 250 | 270 | 15 |

TABLE 1-2

| Sample No. | Fiber | Impregnate resin | Results of paste filled into holes Number of fallen-out holes | Results of conductive reliability of 3000 holes Number of defective holes |
|---|---|---|---|---|
| 1 | aramid | epoxy | 0 | 0 |
| 2 | woven | | 0 | 0 |
| 3 | fabric | | 0 | 0 |
| 4 | | phenol | 0 | 1 |
| 5 | | | 0 | 0 |
| 6 | | | 1 | 0 |
| 7 | | BT | 0 | 0 |
| 8 | | | 0 | 0 |
| 9 | | | 0 | 0 |
| 10 | | polyimide | 0 | 0 |
| 11 | | | 0 | 0 |
| 12 | | | 0 | 0 |
| 13 | aramid | epoxy | 0 | 0 |
| 14 | non- | | 0 | 0 |
| 15 | woven | | 0 | 0 |
| 16 | fabric | phenol | 0 | 1 |

TABLE 1-2-continued

| Sample No. | Fiber | Impregnate resin | Results of paste filled into holes Number of fallen-out holes | Results of conductive reliability of 3000 holes Number of defective holes |
|---|---|---|---|---|
| 17 | | | 0 | 0 |
| 18 | | | 0 | 0 |
| 19 | | BT | 0 | 0 |
| 20 | | | 0 | 0 |
| 21 | | | 1 | 0 |
| 22 | | polyimide | 0 | 0 |
| 23 | | | 0 | 0 |
| 24 | | | 0 | 0 |

First, conductive paste was applied with an even thickness on a peeling film of the substrate by using a screen printing machine. Then, an aspirator was disposed under the substrate having holes through a medium-quality paper of 50 $\mu$m in thickness, and the conductive paste was filled into the holes by decompression to form the filling-via-holes. The monolayer substrates used here all had thicknesses between 120 to 140 $\mu$m. The conductive paste used here was composed of 85% by weight of copper powder with an average particle diameter of 3 micron, 12% by weight of liquid epoxy resin, and 2% by weight of a mixture of a hardener and an accelerator. According to the viscosity of the paste used, the epoxy resin, the hardener and the accelerator can be chosen on the market. Among the total number of filled via holes, a number of via holes of each monolayer substrate material was compared, in which the filling fell off when the medium-quality paper was separated after the application. The results are shown in the above-noted Tables 1-1 and 1-2. As a result, it is clear that the substrates having the via structure of this invention which were opened with carbon dioxide laser have excellent paste holding properties in the filling process.

Copper foils were applied on both sides of the monolayer substrate which were then bonded for one hour with a press temperature of 180° C. and a pressure of 50 kg/cm² by thermocompression in vacuum. Next, the copper foils were patterned into circuits to constitute a double sided board. Then, the above-noted filled via monolayer substrates were disposed on both sides of this double sided board, and copper foils were applied thereon. This was thermocompressed in vacuum under the same conditions as mentioned above. By patterning the copper foils into circuits, a four-layer circuit board was formed which was then tested by heat and impact experiments which were conducted under the conditions of maintaining 30 minutes with 500 cycles at −55° C. and 125° C. 3000 vias disposed with copper foils on both sides were selected in the circuit, and those which had more than twice of resistance amount after the experiments were counted as no good. The results are shown in the above-noted Table 1. As a result, it is clear that the substrates having the via structure of this invention excellent heat shock resistance.

EXAMPLE 11

Monolayer substrates were opened by processing using YAG laser which consisted of 8 kinds of composites: an aramid woven fabric plus phenol resin, epoxy resin, BT resin, and polyimide which are all of thermosetting and uncured nature, and an aramid nonwoven fabric plus phenol resin, epoxy resin, BT resin, and polyimide which are all of thermosetting and uncured nature. Tables 2-1 and 2-2 show the conditions of laser processing, the hole diameter in each case, and the constitution of the holes in 8 kinds of monolayer substrates.

TABLE 2-1

Opening and processing conditions and results by YAG laser

| Sample No. | Fiber | Impregnate resin | Laser conditions on the surface of base material Energy density (mJ/cm²) | Beam size ($\mu$m) | Hole size ($\mu$m) | Maximum penetration amount of base material into holes ($\mu$m) |
|---|---|---|---|---|---|---|
| 25 | aramid | epoxy | 12.2 | 100 | 120 | 8 |
| 26 | woven | | 15.4 | 160 | 180 | 10 |
| 27 | fabric | | 19.0 | 230 | 250 | 14 |
| 28 | | phenol | 12.2 | 100 | 115 | 10 |
| 29 | | | 15.4 | 160 | 180 | 11 |
| 30 | | | 19.0 | 230 | 255 | 17 |
| 31 | | BT | 12.2 | 100 | 110 | 9 |
| 32 | | | 15.4 | 160 | 175 | 11 |
| 33 | | | 19.0 | 230 | 255 | 14 |
| 34 | | polyimide | 12.2 | 100 | 115 | 12 |
| 35 | | | 15.4 | 160 | 185 | 15 |
| 36 | | | 19.0 | 230 | 260 | 17 |
| 37 | aramid | epoxy | 12.2 | 100 | 120 | 9 |
| 38 | non- | | 15.4 | 160 | 185 | 13 |
| 39 | woven | | 19.0 | 230 | 260 | 16 |
| 40 | fabric | phenol | 12.2 | 100 | 120 | 11 |
| 41 | | | 15.4 | 160 | 180 | 16 |
| 42 | | | 19.0 | 230 | 260 | 20 |
| 43 | | BT | 12.2 | 100 | 110 | 9 |
| 44 | | | 15.4 | 160 | 175 | 11 |
| 45 | | | 19.0 | 230 | 260 | 16 |
| 46 | | polyimide | 12.2 | 100 | 115 | 12 |
| 47 | | | 15.4 | 160 | 185 | 15 |
| 48 | | | 19.0 | 230 | 270 | 16 |

TABLE 2-2

| Sample No. | Fiber | Impregnate resin | Results of paste filled into holes Number of fallen-out holes | Results of conductive reliability of 3000 holes Number of defective holes |
|---|---|---|---|---|
| 25 | aramid | epoxy | 0 | 0 |
| 26 | woven | | 0 | 0 |
| 27 | fabric | | 0 | 0 |
| 28 | | phenol | 0 | 1 |
| 29 | | | 0 | 0 |
| 30 | | | 1 | 0 |
| 31 | | BT | 0 | 0 |
| 32 | | | 0 | 0 |
| 33 | | | 1 | 0 |
| 34 | | polyimide | 0 | 0 |
| 35 | | | 0 | 0 |
| 36 | | | 0 | 0 |
| 37 | aramid | epoxy | 0 | 1 |
| 38 | non- | | 0 | 0 |
| 39 | woven | | 0 | 0 |
| 40 | fabric | phenol | 0 | 1 |
| 41 | | | 0 | 0 |
| 42 | | | 1 | 0 |
| 43 | | BT | 0 | 0 |
| 44 | | | 0 | 0 |
| 45 | | | 1 | 0 |
| 46 | | polyimide | 0 | 1 |
| 47 | | | 0 | 1 |
| 48 | | | 0 | 0 |

First, conductive paste was applied with an even thickness on a peeling film of the substrate by using a screen printing machine. Then, an aspirator was disposed under the substrate having holes through a medium-quality paper of 50 μm in thickness, and the conductive paste was filled into the holes by decompression to form the filling-via-holes. The monolayer substrates used here had all thicknesses between 120 to 140 μm. The conductive paste used here was composed of 87% by weight of copper powder with an average particle diameter of 4 micron, 10% by weight of liquid epoxy resin, and 3% by weight of a mixture of a hardener and an accelerator. According to the viscosity of the paste used, the epoxy resin, the hardener and the accelerator can be chosen on the market, as in the first embodiment. Among the total number of filled via holes, a number of via holes of each monolayer substrate material was compared, in which the filling fell off when the medium-quality paper was seperated after the application. The results are shown in the above-noted Table 2. As a result, it is clear that the substrates having the via structure of this invention which were opened with YAG laser have excellent paste holding properties in the filling process.

Copper foils were applied on both sides of the monolayer substrate which were then bonded one hour with press temperature of 180° C. and pressure of 50 kg/cm by thermocompression in vacuum. After that, the copper foils were patterned into circuits to constitute a double sided board. Furthermore, the above-mentioned filled via monolayer substrates were disposed on both sides of this double sided board, and copper foils were applied thereon. This was thermocompressed in vacuum under the same conditions as mentioned above. By patterning the copper foils into circuits, a four-layer circuit board was formed which was then tested by heat and impact experiments which were conducted under the conditions of maintaining 30 minutes with 500 cycles at -55° C. and 125° C. 3000 vias disposed with copper foil on both sides were selected in the circuit, and those which had more than twice of resistance amount after the experiments were counted as no good. The results are shown in the above-noted Table 2. As a result, it is clear that the substrates having the via structure of this invention excellent heat and impact resistance.

EXAMPLE 12

Monolayer substrates were opened by the via processing using excimer laser which consisted of 8 kinds of composites: an aramid woven fabric plus phenol resin, epoxy resin, BT resin, and polyimide which are all of thermosetting and uncured nature, and an aramid nonwoven fabric plus phenol resin, epoxy resin, BT resin, and polyimide which are all of thermosetting and uncured nature. Tables 3-1 and 3-2 show the conditions of laser processing, the hole diameter in each case, and the constitution of the holes in 8 kinds of monolayer boards.

TABLE 3-1

Opening and processing conditions and results by excimer laser

| Sample No. | Fiber | Impregnate resin | Laser conditions on the surface of base material | | | Maximum penetration amount of base material into holes (μm) |
|---|---|---|---|---|---|---|
| | | | Energy density (mJ/cm$^2$) | Beam size (μm) | Hole size (μm) | |
| 49 | glass | epoxy | 0.8 | 40 | 50 | -*1 |
| 50 | woven | | 1.2 | 80 | 100 | -*1 |
| 51 | fabric | | 1.6 | 140 | 170 | -*1 |

TABLE 3-1-continued

Opening and processing conditions and results by excimer laser

| Sample No. | Fiber | Impregnate resin | Laser conditions on the surface of base material | | | Maximum penetration amount of base material into holes (μm) |
|---|---|---|---|---|---|---|
| | | | Energy density (mJ/cm$^2$) | Beam size (μm) | Hole size (μm) | |
| 52 | | phenol | 0.8 | 40 | 55 | -*1 |
| 53 | | | 1.2 | 80 | 110 | -*1 |
| 54 | | | 1.6 | 140 | 180 | -*1 |
| 55 | | BT | 0.8 | 40 | 50 | -*1 |
| 56 | | | 1.2 | 80 | 95 | -*1 |
| 57 | | | 1.6 | 140 | 160 | -*1 |
| 58 | | polyimide | 0.8 | 40 | 50 | -*1 |
| 59 | | | 1.2 | 80 | 90 | -*1 |
| 60 | | | 1.6 | 140 | 50 | -*1 |
| 61 | aramid | epoxy | 0.8 | 40 | 50 | 8 |
| 62 | non- | | 1.2 | 80 | 95 | 10 |
| 63 | woven | | 1.6 | 140 | 160 | 13 |
| 64 | fabric | phenol | 0.8 | 40 | 55 | 7 |
| 65 | | | 1.2 | 80 | 100 | 10 |
| 66 | | | 1.6 | 140 | 160 | 12 |
| 67 | | BT | 0.8 | 40 | 55 | 9 |
| 68 | | | 1.2 | 80 | 100 | 9 |
| 69 | | | 1.6 | 140 | 165 | 11 |
| 70 | | polyimide | 0.8 | 40 | 50 | 8 |
| 71 | | | 1.2 | 80 | 90 | 8 |
| 72 | | | 1.6 | 140 | 155 | 9 |

*1 glass fiber remained inside holes

TABLE 3-2

| Sample No. | Fiber | Impregnate resin | Results of paste filled into holes Number of fallen-out holes | Results of conductive reliability of 3000 holes Number of defective holes |
|---|---|---|---|---|
| 49 | glass | epoxy | 0 | 0 |
| 50 | woven | | 0 | 0 |
| 51 | fabric | | 0 | 0 |
| 52 | | phenol | 0 | 1 |
| 53 | | | 0 | 0 |
| 54 | | | 0 | 1 |
| 55 | | BT | 0 | 0 |
| 56 | | | 0 | 0 |
| 57 | | | 0 | 0 |
| 58 | | polyimide | 0 | 0 |
| 59 | | | 0 | 1 |
| 60 | | | 0 | 0 |
| 61 | aramid | epoxy | 0 | 1 |
| 62 | non- | | 0 | 0 |
| 63 | woven | | 1 | 0 |
| 64 | fabric | phenol | 0 | 1 |
| 65 | | | 0 | 0 |
| 66 | | | 1 | 0 |
| 67 | | BT | 0 | 0 |
| 68 | | | 0 | 0 |
| 69 | | | 0 | 0 |
| 70 | | polyimide | 0 | 1 |
| 71 | | | 0 | 1 |
| 72 | | | 0 | 0 |

First, conductive paste was applied with an even thickness on a peeling film of the substrate by using a screen printing machine. Then, an aspirator was disposed under the substrate having holes through a medium-quality paper of 50 μm in thickness, and the conductive paste was filled into the holes by decompression to form the filling via holes. The monolayer substrates used here all had thicknesses between 120 to 140 µm. The conductive paste used here was the same as in the first embodiment. Among the total number of filled via holes, a number of via holes of each monolayer substrate material was compared, in which the filling fell off when the medium-quality paper was seperated after the application. The results are shown in the above-noted Table 3. As a result, it is clear that the substrates having the via structure of this invention which were opened with an excimer laser have excellent paste holding properties in the process of filling.

Copper foils were applied on both sides of the monolayer substrate which were then bonded one hour with press temperature of 180° C. and pressure of 50 kg/cm² by thermocompression in vacuum. After that, the copper foils were patterned into circuits to constitute a double sided board. Furthermore, the above-mentioned filled via monolayer substrates were disposed on both sides of this double sided board, and copper foils were applied thereon. This was thermocompressed in vacuum under the same conditions as mentioned above. By patterning the copper foils into circuits, a four-layer circuit board was formed which was then tested by heat and impact experiments which were conducted under the conditions of maintaining 30 minutes with 500 cycles at −55° C. and 125° C. 3000 vias disposed with copper foils on both sides were selected in the circuit, and those which had more than twice the resistance amount after the experiments were counted as no good. The results are shown in the above-noted Tables 3-1 and 3-2. As a result, it is clear that the substrates having the via structure of this invention have excellent heat and impact resistance.

As described above, a printed circuit board of this invention comprises an uncured substrate material with closed voids which are disposed with through-holes. When the through-holes are formed, voids which exist in the substrate material open from inner wall of the through-hole to form a hollow-shaped part. By filling the through-hole and the hollow-shaped part with conductive paste, the adhesion improves by the increased anchor effect between the conductive paste and the wall surface of the through-hole. As a result, a printed circuit board of excellent heat-and impact resisting properties can be attained.

According to this invention as mentioned above, a printed circuit board comprises a resin impregnate fiber sheet substrate with through-holes formed in the thickness direction, and a conductive resin compound filled into the through-holes in the direction of thickness for electrical connection, wherein the substrate and the conductive resin compound are bonded to each other. Thus, the adhesion between the conductive resin compound and the wall surface of the through-hole in the substrate improves, thereby attaining a printed circuit board of high reliability.

According to this invention as mentioned above, a method of manufacturing a printed circuit board comprises the steps of: laminating both sides of an uncured resin impregnate fiber sheet substrate material having voids with cover films, forming through-holes into the substrate material in the thickness direction by laser irradiation, filling the through-holes with conductive paste, removing the cover films and applying a metal foil on at least one side of the substrate material, bonding the substrate material with the conductive paste by compressing and hardening the substrate material through heating and pressurization, and forming predetermined patterns on the metal foil in due time. In this way, a circuit board can be produced efficiently and rationally. Especially, by using laser irradiation for forming the through-holes, not only precise and fine work can be conducted, but also a clean production environment can be preserved without creating cutting scraps. This is an advantage over a conventional drilling method.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A printed circuit board comprising:

at least one fiber sheet substrate having one or more through-holes formed therein in a thickness direction of said substrate, wherein said fiber sheet substrate has a top surface and a bottom surface and each of said through-holes has an inner wall surface;

a conductive resin compound filled in said through-holes for electrical connection;

a first circuit pattern formed on the bottom surface of said fiber sheet substrate; and a second circuit pattern formed on the top surface of said fiber sheet substrate, wherein said fiber sheet substrate and said conductive resin are bonded to each other with an anchor effect throughout the inner wall surface of each of said through-holes due to penetration of fibers of said fiber sheet substrate into said conductive resin compound, wherein the penetration of fibers is 7–22 µm into said through-holes.

2. The printed circuit board as in claim 1,. wherein said anchor effect bonding is provided by penetrating the fiber into said conductive resin compound; penetrating said conductive resin compound into voids in said substrate at the through-hole surface; or impregnating the resin of said conductive resin compound into said substrate.

3. The printed circuit board as in claim 1, wherein said anchor effect bonding is provided by penetrating the fiber into said conductive resin compound; penetrating said conductive resin compound into voids in said substrate at the through-hole surface; or impregnating the resin of said conductive resin compound into said substrate.

4. The printed circuit board as in claim 2, wherein said anchor effect bonding is provided by bonding said substrate and said conductive resin compound to each other through covalent bonding, or self-adhesion between the resin of said conductive resin compound and the impregnated resin in said substrate.

5. The printed circuit board as in claim 1, wherein the impregnated resin of said substrate and the resin of said conductive resin compound are both thermosetting resin.

6. The printed circuit board as in claim 5, wherein said thermosetting resin comprises at least one resin selected from the group consisting of epoxy resin, thermosetting polybutadiene resin, phenol resin, and polyimide resin.

7. The printed circuit board as in claim 1, wherein said resin impregnated fiber sheet of the substrate comprises at least one fiber selected from the group consisting of heat-resisting synthetic fiber and glass fiber.

8. The printed circuit board as in claim 7, wherein said heat-resisting synthetic fiber comprises at least one fiber selected from the group consisting of aromatic polyamide fiber and polyimide fiber.

9. The printed circuit board as in claim 1, wherein said resin impregnated fiber sheet of the substrate is a nonwoven fabric.

10. The printed circuit board as claimed in claim 1, wherein the conductive resin compound comprises a metallic particulate, and said metallic particulate comprises at least one metal selected from the group consisting of gold, silver, copper, palladium, nickel, gold alloy, silver alloy, copper alloy, palladium alloy, and nickel alloy.

11. The printed circuit board as in claim 10, wherein said metallic particulate is presented in the conductive resin compound in an amount of from 80 to 92.5 percent by weight.

12. The printed circuit board as in claim 10, wherein each metallic particulate in said conductive resin compound has an average diameter of from 0.2 to 20 $\mu$M.

13. The printed circuit board as in claim 1, wherein the at least one through-hole filled with said conductive resin compound has an average diameter of from 50 to 300 $\mu$m.

14. The printed circuit board as in claim 1, wherein a circuit pattern is formed on the surface of said substrate, and also formed at a terminal of said conductive resin compound.

15. The printed circuit board as in claim 1, wherein said substrate is either one sheet or a plurality of sheets.

* * * * *